(12) United States Patent
Zhang et al.

(10) Patent No.: US 6,472,256 B1
(45) Date of Patent: Oct. 29, 2002

(54) METHOD OF MANUFACTURING A THIN-FILM TRANSISTOR WITH A SHORT-CIRCUITING PATTERN

(75) Inventors: Hong Yong Zhang; Yoshio Nagahiro, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 3 days.

(21) Appl. No.: 09/680,368

(22) Filed: Oct. 5, 2000

(30) Foreign Application Priority Data

Oct. 29, 1999 (JP) .......................................... 11-310409

(51) Int. Cl.[7] .............................................. H01L 21/84
(52) U.S. Cl. ...................................................... 438/151
(58) Field of Search ................................. 438/151, 156, 438/161, 162

(56) References Cited

U.S. PATENT DOCUMENTS 5,068,748 A * 11/1991 Ukai et al. ..................... 257/59
5,899,708 A * 5/1999 Tanaka et al. .............. 438/149

* cited by examiner

*Primary Examiner*—Richard Elms
*Assistant Examiner*—Beth E. Owens
(74) *Attorney, Agent, or Firm*—Greer, Burns & Crain, Ltd.

(57) ABSTRACT

When a thin-film transistor (TFT) is formed on a glass substrate, electric charges caused in the TFT can be removed so as to avoid electrostatic damage in the TFT. A short-circuiting pattern that short-circuits the source region and the drain region of the TFT is added to a polysilicon pattern that constitutes the TFT. This short-circuiting pattern is removed at the same time as or after the wiring formation in the source region and the drain region.

14 Claims, 28 Drawing Sheets

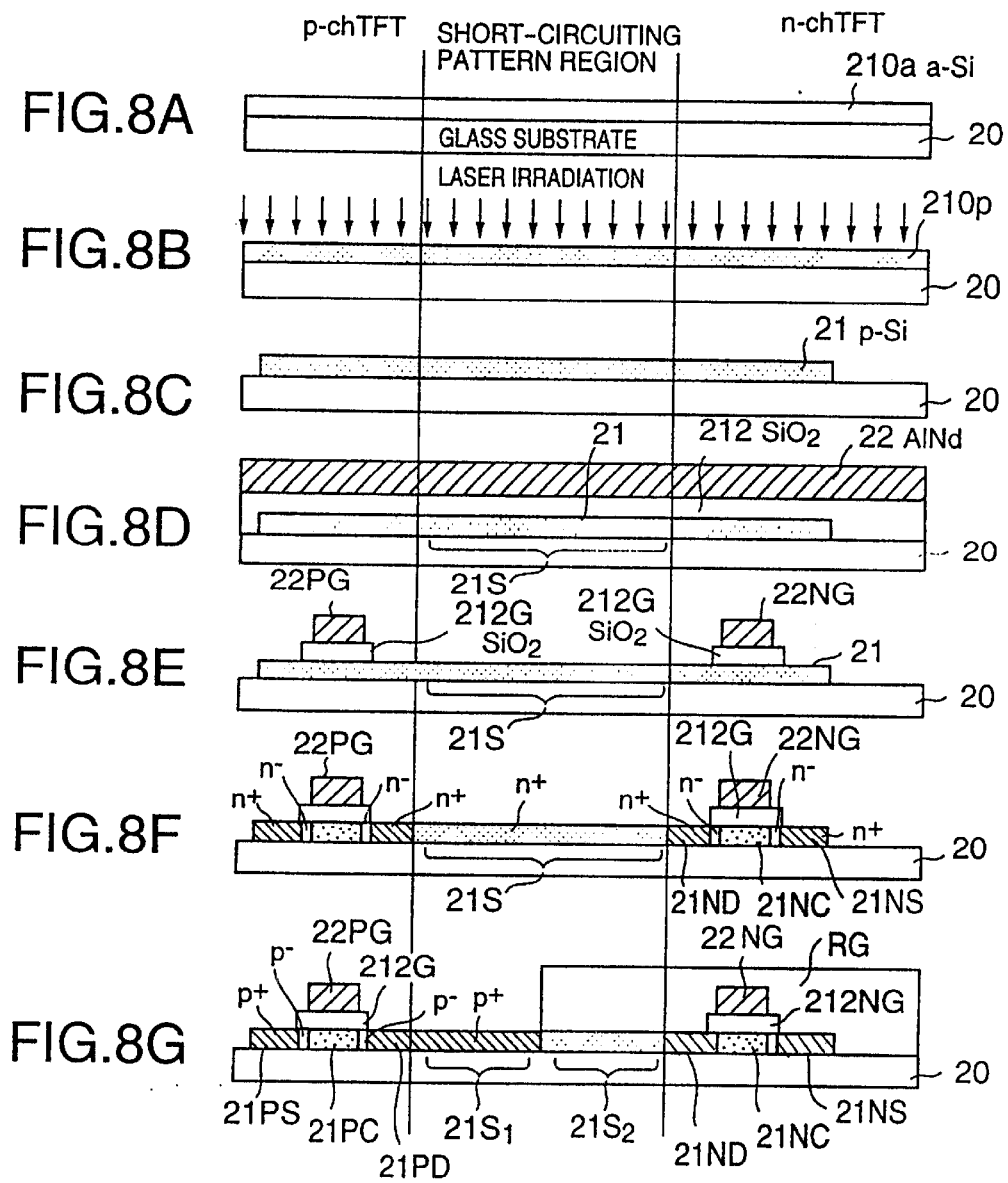

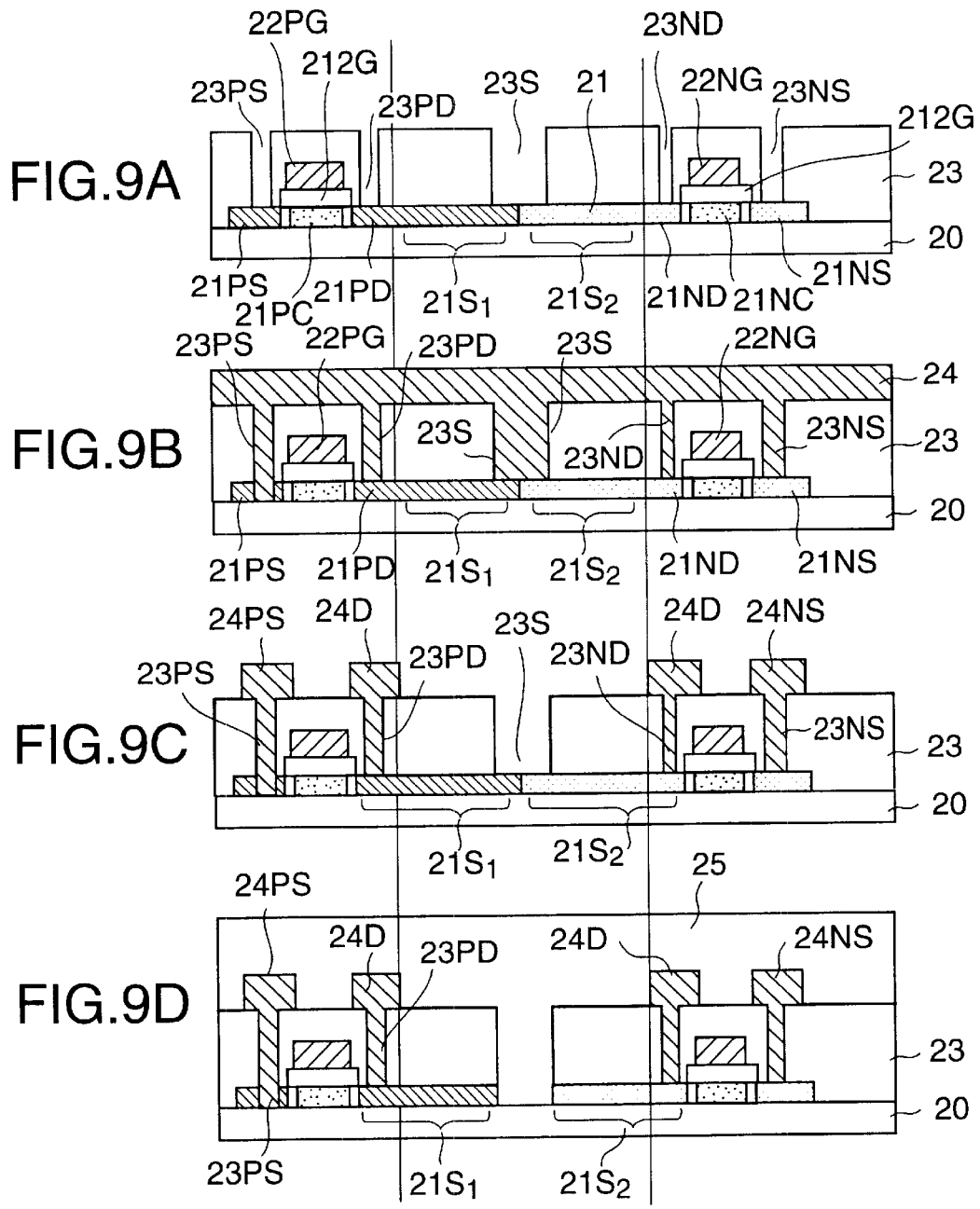

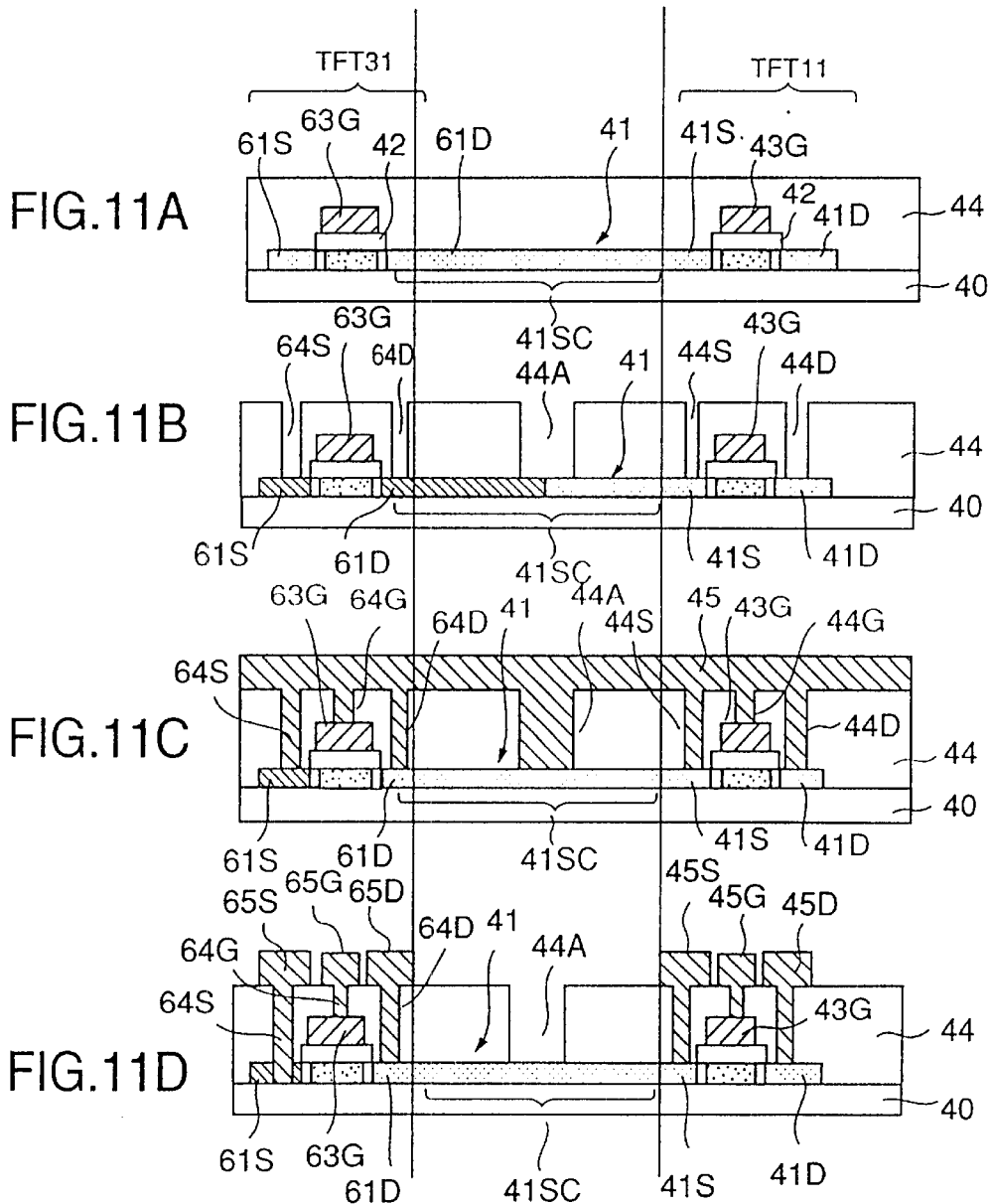

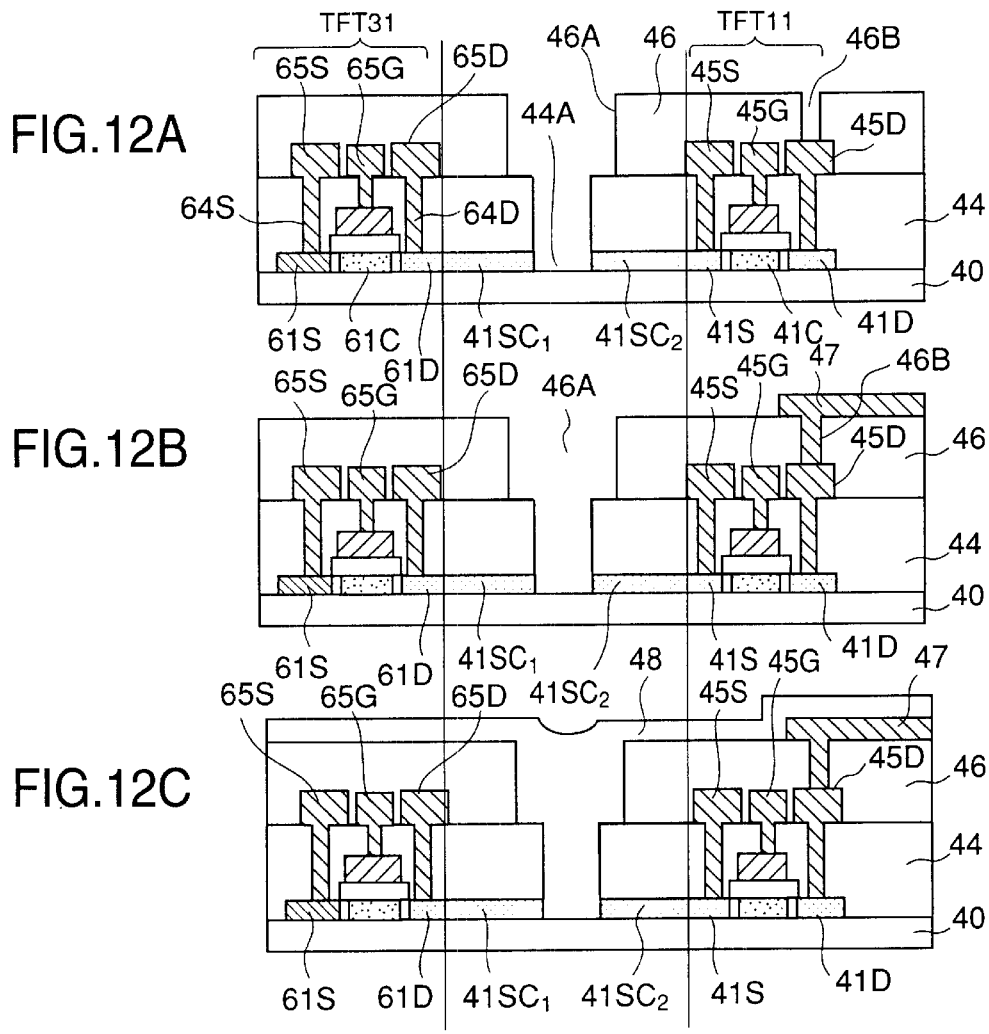

METHOD OF MANUFACTURING A THIN-FILM TRANSISTOR WITH A SHORT-CIRCUITING PATTERN

BACKGROUND OF THE INVENTION

1. Field of the Invention

The present invention generally relates to liquid-crystal display devices, and, more particularly, to a liquid-crystal display device of an active-matrix type having a thin-film transistor and a method of producing such a liquid-crystal display device.

2. Description of the Related Art

Liquid-crystal display devices are compact and consume lower power, and, for these reasons, have been widely used in portable information processing devices, such as notebook-type personal computers. However, the use of liquid-crystal display devices is not limited to portable information processing devices. Actually, the liquid-crystal display devices have started replacing conventional CRT display devices in desktop information processing devices. Moreover, the liquid-crystal display devices are greatly expected to serve as displays for high-definition television (HDTV), and particularly for projection HDTV.

With those high-performance large-area liquid-crystal display devices, the conventional simple matrix driving system is not adequate to satisfy various conditions such as the response rate, the contrast ratio, the color purity, and so forth. Therefore, the active-matrix driving system, in which each pixel is driven by a corresponding thin-film transistor (TFT), is employed. In a liquid-crystal display device, an amorphous silicon liquid-crystal display using amorphous silicon in the active regions of TFTs has been conventionally used. However, the electron mobility of amorphous silicon is small, and cannot satisfy the conditions required in the above high-performance liquid-crystal display devices. Accordingly, it is preferable to use polysilicon TFTs in those high-performance liquid-crystal display devices.

FIG. 1 is a schematic view showing the structure of a conventional active-matrix liquid-crystal display device. As shown in FIG. 1, the liquid-crystal display device comprises a TFT glass substrate 1A that carries a large number of TFTs and transparent pixel electrodes in cooperation with the TFTs, and a counter glass substrate 1B formed on the TFT glass substrate 1A. Between the TFT glass substrate 1A and the counter glass substrate 1B, a liquid-crystal layer 1 is sealed by a sealing member 1C. In the liquid-crystal display device, the transparent pixel electrodes are selectively driven via each corresponding TFT, so that the orientations of liquid-crystal molecules can be selectively varied with each selected transparent pixel electrode in the liquid-crystal layer. Outside the glass substrates 1A and 1B, polarizing plates (not shown) are arranged in a crossed-Nicol state. Inside the glass substrates 1A and 1B, a molecular orientation film (not shown) is formed in contact with the liquid-crystal layer 1, thereby restricting the orientations of the liquid-crystal molecules.

FIG. 2 is a sectional view of the liquid-crystal display device shown in FIG. 1.

As shown in FIG. 2, a large number of pixel TFTs 11 and a peripheral circuit 1PR for driving the pixel TFTs 11 are formed on the TFT glass substrate 1A. Also, connection terminals and a pad electrode 1c are formed outside the sealing member 1C. The peripheral circuit 1PR is also constituted by TFTs, and an interlayer insulating film 1AI is formed in the region enclosed by the sealing member 1C on the TFT glass substrate 1A in such a manner that the interlayer insulating film 1AI covers the peripheral circuit 1PR and the pixel TFTs 11. On the interlayer insulating film 1AI, a large number of pixel electrodes 14 are formed in contact with the respective pixel TFTs 11. On the interlayer insulating film 1AI, a molecular orientation film 1MO is further formed in such a manner that the molecular orientation film 1MO covers the pixel electrodes 14 and is brought into contact with the enclosed liquid-crystal layer 1.

A large number of color filter patterns 1CF corresponding to the pixel electrodes 14 are formed on the glass substrate 1B, and light blocking patterns IBM are formed between the color filter patterns 1CF. On the counter glass substrate 1B, a flattening insulating film 1BI is formed so as to cover the color filter patterns 1CF and the light blocking patterns 1BM. On the flattening insulating film 1BI, a counter transparent electrode 1ITO is uniformly formed. The counter transparent electrode 1ITO is covered with another molecular orientation film 1MO, which is in contact with the liquid-crystal layer 1. The molecular orientation films 1MO restrict the orientations of the liquid-crystal molecules in the liquid-crystal layer 1.

Furthermore, a first polarizing film 1PL is formed on the lower surface of the TFT glass substrate 1A, while a second polarizing film 1AL is formed on the upper surface of the counter glass substrate 1B, in such a manner that the polarizing axes are perpendicular to each other.

FIG. 3 is an enlarged view of a part of the TFT glass substrate 1A shown in FIG. 1.

As shown in FIG. 3, a large number of pad electrodes 13A that receive scanning signals, a large number of scanning electrodes 13 extending from the pad electrodes 13A, a large number of pad electrodes 12A that receive video signals, and a large number of signal electrodes 12 extending from the pad electrodes 12A, are formed on the glass substrate 1A in such a manner that the extending direction of the scanning electrodes 13 is substantially perpendicular to the extending direction of the signal electrodes 12. At each intersection of the scanning electrodes 13 and the signal electrodes 12, the TFT 11 is formed. Furthermore, the transparent pixel electrodes described before are formed so as to correspond to the respective TFTs 11. Each of the TFTs 11 is selected in accordance with the scanning signal on each corresponding scanning electrode 13, and each cooperative transparent pixel electrode 14 is driven in accordance with the video signal on each corresponding signal electrode 12. In FIG. 3, the pad electrodes 12A and 13A are equivalent to the pad electrode 1c shown in FIG. 2.

On such an insulating glass substrate, however, static electricity is often generated due to various factors during the production of the TFT. For instance, in a case where the insulating glass substrate is attached to or removed from a processing machine, a transportation means, a jig, or a substrate holder, static electricity enters the substrate from the outside. Also, various plasma processes used for forming the TFTs on the substrate, such as the plasma CVD method, the sputtering method, or the RIE process, might result in the accumulation of static electricity inside the substrate. In these plasma processes, the conductive patterns or the diffusion regions function as antennas, and the differences in effective area among the antennas induce potential differences in the substrate. Since the substrate itself is an insulator, the induced potential differences cannot be cancelled, resulting in unrecoverable permanent damage, partially recoverable semi-permanent damage, overruns due to variations of the threshold voltage, characteristic deterioration due to a decrease of mobility, poor long-term reliability due to potential problems, or the like. As a result, the yield of the liquid-crystal display device is reduced.

To avoid the above problems, a peripheral short-circuiting ring is formed so as to surround a plurality of panel regions on a common glass substrate including the panel regions, and the TFTs within the panel regions are connected to the peripheral short-circuiting ring, thereby preventing the accumulation of electric charges on the substrate.

FIG. 4 shows an example of a common glass substrate 100 having a peripheral short-circuiting ring formed in each panel region. In FIG. 4, the same components as in the foregoing figures are denoted by the same reference numerals.

As shown in FIG. 4, a plurality of panel regions 100A outlined by scribe regions including scribe lines SL indicated by dotted lines in the figure are formed on the common glass substrate 100. In each of the panel regions 10A, a TFT array constituted by the TFTs 11 shown in FIG. 2 is formed. A scanning-side peripheral circuit 13B that operates in cooperation with the TFT array and selects one of the scanning electrodes 13, and a signal-side peripheral circuit 12B that operates in cooperation with the TFT array and selects one of the signal electrodes 12 are further formed in each of the panel regions 100A. The scanning-side peripheral circuit 13B and the signal-side peripheral circuit 12B are equivalent to the peripheral circuit 1PR described with reference to FIG. 2.

In each of the panel regions 100A, a peripheral short-circuiting ring 15S that extends along the boundary of the scribe region is formed in such a manner as to surround the TFT array and the peripheral circuits 12B and 13B, and each signal electrode 12 and each scanning electrode 13 in the TFT array are connected to the peripheral short-circuiting ring 15S. The pad electrodes 12A and 13A (not shown in FIG. 4), which are formed along the outer periphery of the panel regions, are also electrically connected to the peripheral short-circuiting ring 15S via a terminal short bar 13S.

With the above structure, the static electricity generated in the display region escapes to the peripheral short-circuiting ring 15S via the signal electrodes 12, the scanning electrodes 13, and the short bar 13S, thereby preventing electrostatic damage in the elements formed in the display region. The peripheral short-circuiting ring 15S is removed when the common glass substrate is divided into individual display panels by cutting along the scribe regions.

Meanwhile, in the conventional structure shown in FIG. 4, the pixel electrodes 14 for driving liquid cells or the accumulation volumes C disposed in parallel with the pixel electrodes 14 are connected to the peripheral short-circuiting ring 15S via the TFTs 11. If electric charges are generated in the pixel electrode 14 and the accumulation volume C during the production of the liquid panel, electrostatic damage in the TFTs 11 cannot be effectively prevented even with the peripheral short-circuiting ring 15S. Likewise, if static electricity is generated in the TFT, charging cannot be prevented by the peripheral short-circuiting ring 15S.

In the conventional procedures of producing the conventional liquid-crystal display device, as shown in FIG. 5A, a testing terminal 16 is disposed between each pad electrode 12A or 13A and each corresponding peripheral circuit 12B or 13B, so that various electric tests can be performed on a display panel that is being produced. Since the pad electrodes 12A and 13A are connected to the peripheral short-circuiting ring 15S at this point, a resistance r0 is interposed between each pad electrode 12A or 13A and the peripheral short-circuiting ring 15S.

Conventionally, the resistance r0 has a constant resistance value of 100 kΩ, for instance.

As shown in FIG. 5B, a clock T1, a positive power source voltage T2, and a negative power source voltage T3 are supplied to each pad electrode 13A, and these signals or power source voltages are then supplied to a CMOS inverter circuit that constitutes the peripheral circuit 13B. As for each pad electrode 12A and each corresponding peripheral circuit 12B, the same structure is employed.

FIG. 5C is an equivalent circuit diagram of a part including one of the pad electrodes 12A, the corresponding one of the peripheral circuits 12B, and the peripheral short-circuiting ring 15S.

As shown in FIG. 5C, the impedance (rin) of the pad electrode 13A, to which the clock T1 is inputted, is much greater than the resistance r0, because the CMOS inverter circuit has great input impedance. On the other hand, the impedance R at a pad electrode 13A that receives the positive power source voltage and a pad electrode 13A that receives the negative power source voltage can be expressed as:

$$R=r0\times(R0+rin)/[r0+(r0+rin)]$$

wherein rin is the internal resistance of the CMOS inverter circuit. In this case, the value of the internal resistance rin is smaller than r0, and the value rin might vary with each of the pad electrodes 13A. This means that the apparent resistance value between the pad electrodes 13A and the peripheral short-circuiting ring 15S varies with each of the pad electrodes 13A. Meanwhile, if the value of the resistance R varies with the pad electrodes 13A, there is a possibility of causing great potential differences between the pad electrode that receives the clock T1, the electrode pad that receives the positive power source voltage, and the pad electrode 13 that receives the negative power source voltage. With such great potential differences, the MOS transistor that constitutes the CMOS inverter circuit might be electrostatically damaged.

SUMMARY OF THE INVENTION

A general object of the present invention is to provide a novel liquid-crystal display device and a method of producing the same in which the above disadvantages are eliminated.

A more specific object of the present invention is to provide a method of producing a liquid-crystal display device that can solve the problem of electrostatic damage in the TFT caused due to charges generated inside the TFT on the glass substrate during the production of an active-matrix liquid-crystal display using a peripheral short-circuiting ring.

Another specific object of the present invention is to provide a method of producing a liquid-crystal display device that can prevent a potential difference from being caused between the TFTs on the glass substrate due to such conditions as the pixel electrode shape, the wiring area, and the circuit structure, during the production of an active-matrix liquid-crystal display using a peripheral short-circuiting ring.

Yet another specific object of the present invention is to provide a liquid-crystal display device that includes a CMOS circuit in which no variation in threshold value of the TFTs is caused by static electricity.

Still another specific object of the present invention is to provide a method of producing a liquid-crystal display device that can restrict the generation of potential differences in the TFT circuits during the production of an active-matrix liquid-crystal display in which the TFT circuits are connected to a peripheral short-circuiting ring via resistances.

The above objects of the present invention are achieved by a method of producing a thin-film transistor on an insulating substrate, which method comprises the steps of:

forming a polysilicon pattern on the insulating substrate, the polysilicon pattern including a first region of a first conductivity, a second region of the first conductivity, a first bridging region that connects the first region and the second region, and a second bridging region that connects the first region and the second region;

forming an insulating film on the insulating substrate in such a manner that the insulting film covers the polysilicon pattern;

forming a gate electrode pattern on the insulating film in such a manner that the gate electrode pattern covers the first bridging region;

forming a wiring pattern on the first region in such a manner that the wiring pattern is in contact with the first region; and cutting the second bridging region after the step of forming the wiring pattern.

In the above method, the step of forming the polysilicon pattern includes the step of providing a conductivity to the second bridging region.

The above objects of the present invention are also achieved by a thin-film transistor that includes:

an insulating substrate;

a polysilicon pattern formed on the insulating substrate, the polysilicon pattern including a first region of a first conductivity, a second region of the first conductivity, and a channel region that connects the first region and the second region;

a gate insulating film that covers the channel region; and a gate electrode pattern formed on the channel region.

In this thin-film transistor, the polysilicon pattern has a first extending portion that extends from the first region to a first top end, and a second extending portion that extends from the second region to a second top end.

The above objects of the present invention are also achieved by a liquid-crystal display device that comprises:

a first glass substrate;

a second glass substrate that faces the first glass substrate, with a gap being maintained between the first glass substrate and the second glass substrate;

a liquid-crystal layer enclosed in the gap; and a thin-film transistor formed on a surface of the first glass substrate, the surface facing the second glass substrate.

In this liquid-crystal display device, the thin-film transistor includes:

a polysilicon pattern formed on the surface of the first glass substrate, the polysilicon pattern including a first region of a first conductivity, a second region of the first conductivity, and a channel region that connects the first region and the second region;

a gate insulating film that covers the channel region; and a gate electrode pattern formed on the channel region.

In this thin-film transistor, the polysilicon pattern has a first extending portion that extends from the first region to a first top end, and a second extending portion that extends from the second region to a second top end.

The above objects of the present invention are also achieved by a thin-film transistor substrate that comprises:

a glass substrate having a panel region formed thereon;

a conductive peripheral short-circuiting ring that is formed in the panel region on the glass substrate and extends along the boundary of the panel region without a gap;

an internal circuit that is formed in the panel region on the glass substrate, includes a plurality of thin-film transistors formed on the glass substrate, and is provided with a plurality of connection terminals; and a plurality of resistance elements that are formed in the panel region on the glass substrate, each of the plurality of resistive elements electrically connecting a respective one of the plurality of connection terminals to the peripheral short-circuiting ring.

In this thin-film transistor substrate, the resistance values are selected such that the impedance at each connection terminal is substantially constant.

With the above method and liquid-crystal display device of the present invention, the problem of uneven potential difference that has been caused by the differences in electrode shape and area can be eliminated by adding a bridging region that bridges the source region and the drain region to a polysilicon pattern that includes the source region, the drain region, and the bridging region of a thin-film transistor. Since the step of cutting the bridging region is performed at the same time as the step of forming a contact hole in the thin-film transistor, the number of production steps can be prevented from increasing. The present invention is particularly effective in the production of an active-matrix liquid-crystal display in which a large number of plasma processes are performed.

With the thin-film transistors of the present invention, the problem of electrostatic damage or deterioration of thin-film transistors that constitute the internal circuit, due to potential differences induced by differences in impedance at the connection terminals, can be eliminated from the internal circuit.

The above and other objects and features of the present invention will become more apparent from the following description taken in conjunction with the accompanying drawings.

BRIEF DESCRIPTION OF THE DRAWINGS

FIGS. 8A to 8G illustrate the steps of producing the TFT-CMOS circuit of FIG. 7A;

FIGS. 9A to 9D illustrate the steps of producing the TFT-CMOS circuit of FIG. 7A;

FIGS. 11A to 11D illustrates the steps of producing the liquid-crystal display device including the pixel TFT of FIG. 10;

FIGS. 12A to 12C illustrate the steps of producing the liquid-crystal display device including the pixel TFT of FIG. 10;

DESCRIPTION OF THE PREFERRED EMBODIMENTS

Functions

In accordance with one feature of the present invention, problems of charging in thin-film transistors and uneven potential differences due to the differences in shape and area between electrodes can be solved by a bridging region that bridges the source region and the drain region in each thin-film transistor during the formation of the thin-film transistors on an insulating substrate of a liquid-crystal display device. Those problems could not be eliminated by the conventional peripheral short-circuiting ring. In the present invention, a step of cutting the bridging region and a step of forming contact holes in the thin-film transistors are performed at the same time, thereby reducing the total number of production steps. The present invention is particularly effective in the steps of producing a liquid-crystal display device of an active-matrix driving type in which various plasma processes are performed.

In accordance with another feature of the present invention, a thin-film transistor substrate comprises a glass substrate that has panel regions formed thereon, a conductive peripheral short-circuiting ring that is formed in the panel regions on the glass substrate and extends along the boundaries of the panel regions, and an internal circuit including a plurality of thin-film transistors and a plurality of connection terminals. The resistance values of a plurality of resistance elements formed in the panel regions on the glass substrate, each of the plurality of resistors connecting a respective one of the connection terminals to the peripheral short-circuiting ring, are selected so that impedance at the connection terminals are made substantially constant for the testing of the internal circuit during the production of the thin-film transistor substrate. By doing so, voltage differences caused by the differences in impedance values at the connection terminals are eliminated from the internal circuit. Furthermore, electrostatic damage and deterioration of the thin-film transistors that constitute the internal circuit can also be eliminated.

First Embodiment

Figure 6A:
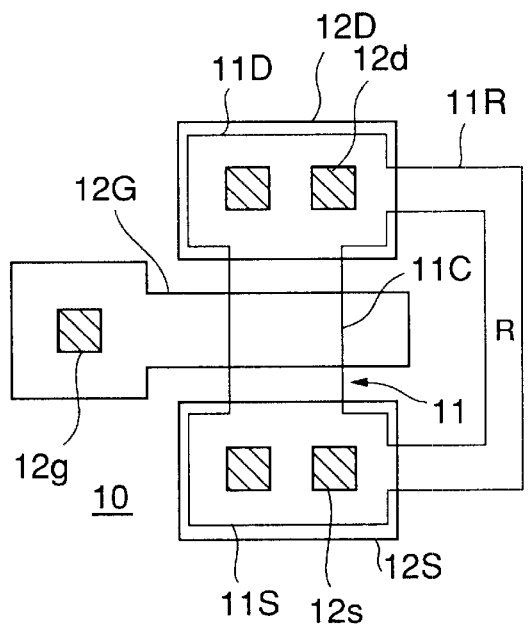
FIGS. 6A to 6D illustrate the steps of producing a TFT in accordance with a first embodiment of the present invention.
Figure 6B:
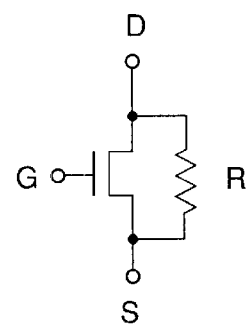
Figure 6C:
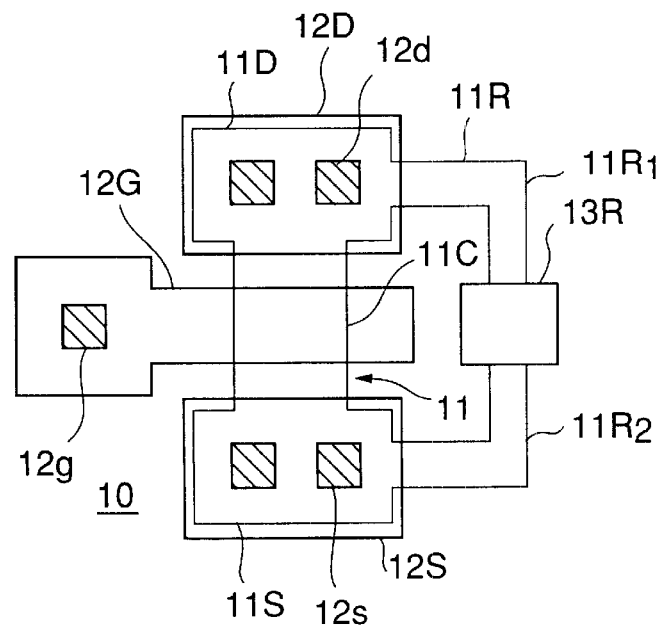
Figure 6D:
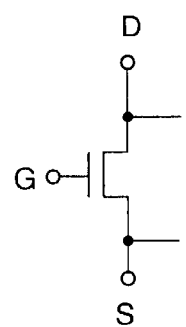

FIGS. 6A to 6D illustrate the steps of producing a TFT (thin-film transistor) in accordance with a first embodiment of the present invention. FIG. 6B is an equivalent circuit diagram of FIG. 6A, while FIG. 6D is an equivalent circuit diagram of FIG. 6C.

As shown in FIG. 6A, a polysilicon pattern 11 comprising a source region 11S, a drain region 11D, and a channel region 11C that connects the source region 11S and the drain region 11D, is formed on an insulating substrate 10 made of glass or the like. A gate electrode pattern 12G made of AlNd or the like is formed on the polysilicon pattern 11 so as to cover the channel region 11C, with a gate oxide layer (not shown) being interposed between the polysilicon pattern 11 and the gate electrode pattern 12G. Doping with an n-type or p-type impurity element is carried out on the source region 11S and the drain region 11D, with the gate electrode pattern 12G serving as a self-aligned mask. The polysilicon pattern 11 and the gate electrode pattern 12G are covered with an insulating film (not shown). A source electrode 12S corresponding to the source region is formed on the insulating film, and a drain electrode 12D corresponding to the drain region 11D is formed on the insulating film. The source electrode 12S and the drain electrode 12D are in contact with the source region 11S and the drain region 11D through contact holes 11s and 11d formed in the insulating film. Also, a contact hole 12g for exposing the gate electrode pattern 12G is formed in the insulating film.

In the structure shown in FIG. 6A, the polysilicon pattern 11 includes a pattern 11R that connects the source region 11S and the drain region 11D. This pattern 11R is provided with conductivity so as to form a resistor R that short-circuits the source region 11S and the drain region 1D, as shown in the equivalent circuit diagram of FIG. 6B. It is preferable that doping is carried out on the pattern 11R with the same impurity element of the same conductivity as with the source region 11S and the drain region 11D.

As shown in the equivalent circuit diagram of FIG. 6B, since the source region 11S and the drain region 11D of the TFT are connected by the pattern 11R in the state shown in FIG. 6A, the TFT is not electrostatically damaged, even if a potential is generated in a wiring pattern connected to the drain electrode 12D and the source electrode 12S due to charges or antenna effects accompanying plasma processing.

With the short-circuiting pattern 11R, no electric charges from the drain electrode 12D and the source electrode 12S accumulate in the polysilicon pattern 11. Accordingly, large electric stress is not applied to the gate oxide film in the drain region 11D or between the gate electrode pattern 12G and the drain region 11D or the source region 11S, thereby eliminating the problem of varying threshold characteristics of the TFT.

Furthermore, with the short-circuiting pattern 11R, the TFT is permanently or semipermanently protected from damage, even if electric shock is applied to the TFT from the outside during production thereof. Also, potential defects which are often caused by electric shock can be prevented. Thus, the resultant TFT has excellent long-term reliability. Furthermore, in a case where a large number of TFTs having different channel lengths and widths are formed on the insulating substrate 10, the short-circuiting pattern 11R is very effective in solving the problems of uneven charging and electrostatic damage caused by the difference in size.

After the steps shown in FIGS. 6A and 6B, an opening 13R for exposing the polysilicon pattern 11R is formed in the insulating film. The polysilicon pattern 11R is cut through the opening 13R, so that the short-circuiting between the source region 11S and the drain region 11D can be eliminated, as shown in the equivalent circuit diagram of FIG. 6D. The TFT shown in FIG. 6C characteristically comprises a first polysilicon pattern $11R_1$ extending from the source region 11S to the opening 13R, and a second polysilicon pattern $11R_2$ extending from the drain region 11D to the opening 13R.

Second Embodiment

Figure 7A:
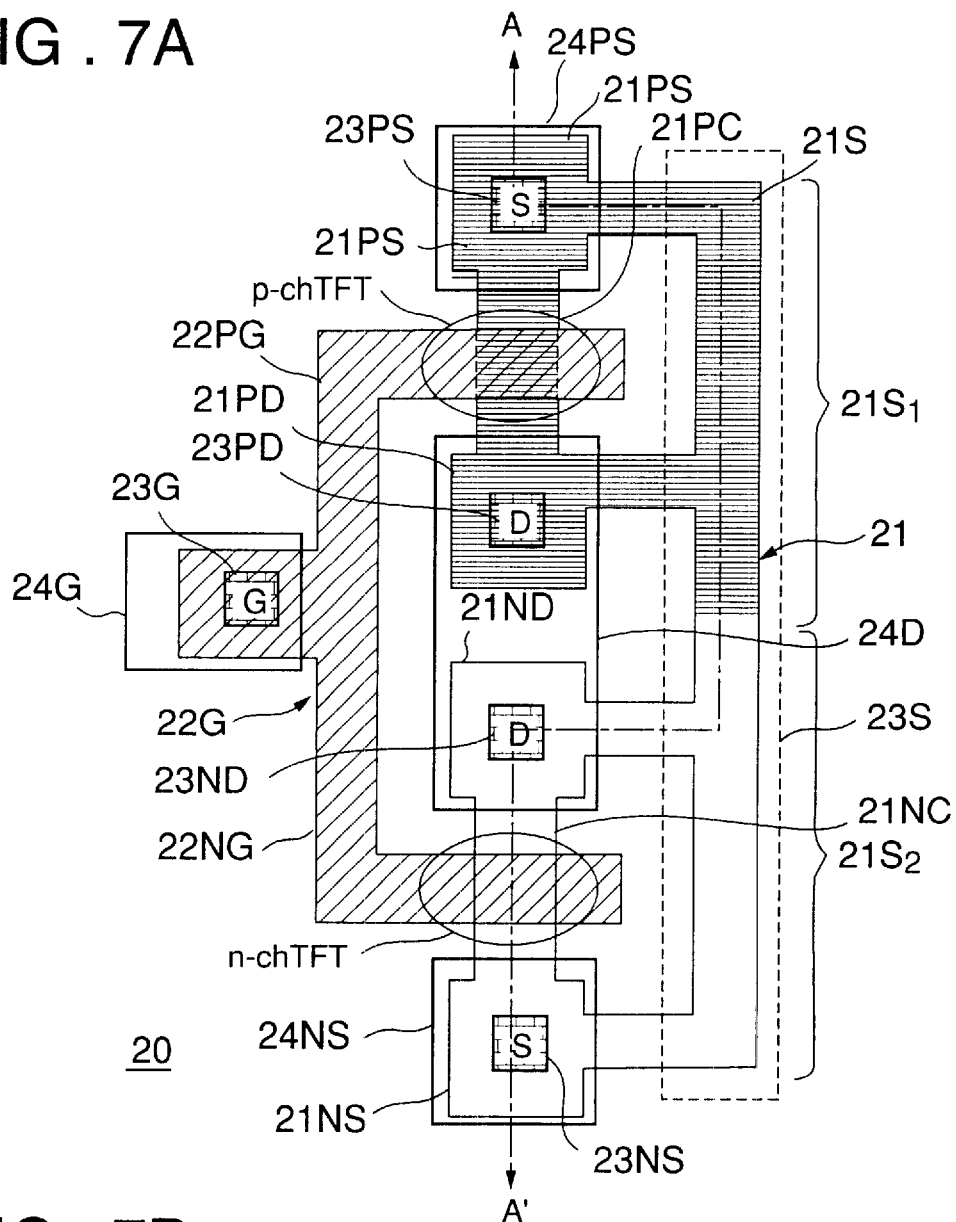
FIG. 7A and 7B illustrate the structure of a TFT-CMOS circuit in accordance with a second embodiment of the present invention.
Figure 7B:
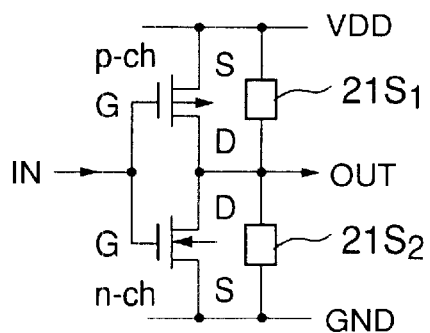

FIG. 7A shows the structure of a CMOS circuit in which a TFT of a second embodiment of the present invention is employed. FIG. 7B is an equivalent circuit diagram of FIG. 7A. As will be described later, the CMOS circuit of this embodiment can be applied to various driving circuits of liquid-crystal display devices, such as the signal-side peripheral circuit 12B or the scanning-side peripheral circuit 13B shown in FIG. 4.

Figure 1:
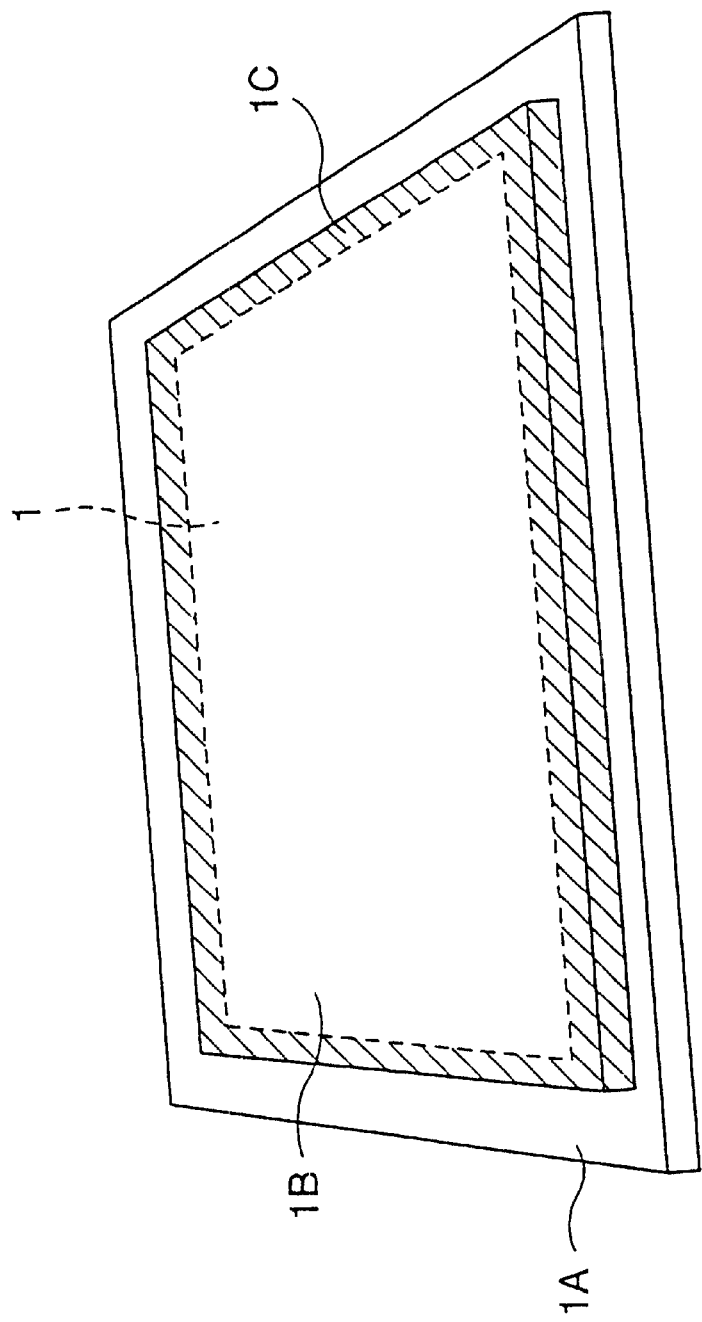
FIG. 1 is a schematic view of a conventional liquid-crystal display device.
Figure 2:
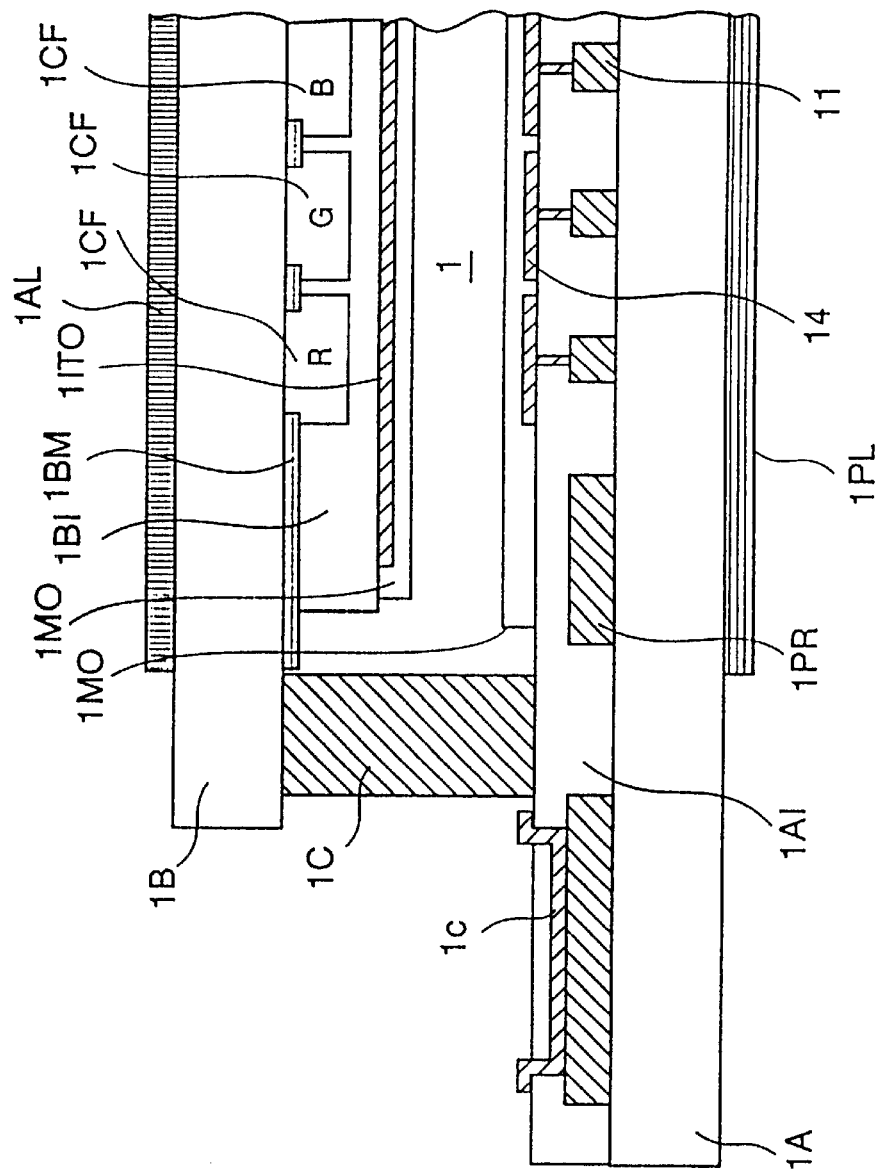
FIG. 2 is a sectional view of the liquid-crystal display device of FIG. 1.
Figure 3:
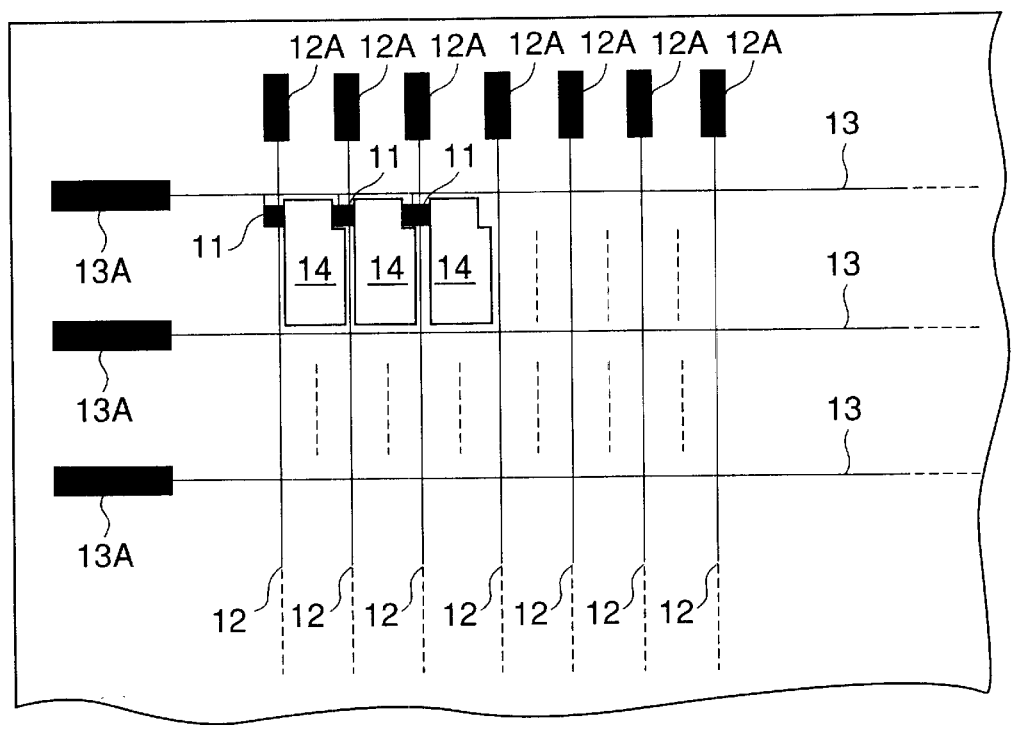
FIG. 3 is an enlarged view of a part of the liquid-crystal display device of FIG. 1.

As shown in FIG. 7A, the CMOS circuit is formed on an insulating substrate 20 equivalent to the TFT glass substrate 1A shown in FIGS. 1 to 3. On the insulating substrate 20, a polysilicon pattern 21 that constitutes a p-channel TFT (p-chTFT) and an n-channel TFT (n-chTFT) is formed. The polysilicon pattern 21 comprises a portion 21PS that serves as the source region of the p-channel TFT, a portion 21PD that serves as the drain region of the p-channel TFT, and a portion 21PC that serves as the channel region of the p-channel TFT. The channel region 21PC is formed by the connection of the source region 21PS and the drain region 21PD.

Likewise, the polysilicon pattern 21 comprises a portion 21NS that serves as the source region of the n-channel TFT, a portion 21ND that serves as the drain region of the n-channel TFT, and a portion 21NC that serves as the channel region of the n-channel region TFT. The channel region 21NC is formed by the connection between the source region 21NS and the drain region 21ND.

The polysilicon pattern 21 is covered with a gate oxide film (not shown), and an AlNd gate electrode pattern 22G including a gate electrode 22PG that covers the channel region 21PC of the p-channel TFT and another gate electrode 22NG that covers the channel region 21NC of the n-channel TFT is formed on the gate oxide film. Further, the polysilicon pattern 21 and the gate electrode pattern 22G thereon are covered with an insulating film 23 (not shown in FIG. 7A), and a source electrode pattern 24PS corresponding to the source region 21PS is formed on the insulating film 23 in such a manner that the source electrode pattern 24PS is brought into contact with the source region 21PS through a contact hole 23PS formed in the insulating film 23. Likewise, a source electrode pattern 24NS corresponding to the source region 21NS is formed on the insulating film 23 in such a manner that the source electrode pattern 24NS is brought into contact with the source region 21NS through a contact hole 23NS formed in the insulating film 23. Further, a drain electrode pattern 24D corresponding to the drain regions 21PD and 21ND is formed on the insulating film in such a manner that the drain electrode pattern 24D is brought into contact with the drain region 21PD through a contact hole 23PD formed in the insulating film, and also brought into contact with the drain region 21ND through a contact hole 23ND formed in the insulating film 23. A gate wiring pattern 24G is further formed on the insulating film 23 in such a manner that the gate wiring pattern 24G is brought into contact with the gate electrode pattern 22G through a contact hole 23G.

The drain electrode pattern 24D connects the p-channel TFT and the N-channel TFT, as shown in the equivalent circuit diagram of FIG. 7B. Here, p-type doping is carried out on the source region 21PS and the drain region 21PD of the p-channel TFT by an ion injection process, with the gate electrode 22PG serving as a self-aligned mask, while n-type doing is carried out on the source region 21NS and the drain region 21ND of the n-channel TFT by the ion injection process, with the gate electrode 22PG serving as a self-aligned mask. As will be described later with respect to the manufacturing procedure, the p-channel TFT and the n-channel TFT each have an LDD structure.

In the structure shown in FIG. 7A, the polysilicon pattern 21 includes a short-circuiting pattern 21S that connects the source region 21PS, the drain region 21PD, the drain region 21ND, and the source region 21NS. As on the source region 21PS and the drain region 21PD, p-type doping is carried out on a portion $21S_1$ connecting the source region 21PS and the drain region 21PD. Meanwhile, as on the source region 21NS and the drain region 21ND, n-type doping is carried out on a portion $21S_2$ connecting the source region 21NS and the drain region 21ND.

After the completion of the CMOS circuit shown in FIG. 7A, the short-circuiting pattern 21 is removed by etching at an opening 23S, thereby releasing the short-circuiting among the source region 21PS, the drain region 21PD, the drain region 21ND, and the source region 21NS.

FIGS. 8A to 9D illustrate the steps of producing the TFT-CMOS circuit shown in FIGS. 7A and 7B. Each of FIGS. 8A to 9D is a sectional view of the TFT-CMOS circuit taken along the line A–A' of FIG. 7A.

As shown in FIG. 8A, the glass substrate 20 is a glass slab made of Corning #1737 or the like. After washing the surface of the glass substrate 20, a $SiO_2$ film (not shown) having a thickness of 150 to 300 nm, more preferably a thickness of approximately 200 nm, is deposited on the glass substrate 20 by the plasma CVD method. A SiN film (not shown) having a thickness of approximately 50 nm is further deposited on the $SiO_2$ film by the plasma CD method. An amorphous Si film 210a typically having a thickness of 20 to 100 nm, more preferably having a thickness of 40 to 50 nm, is then uniformly deposited by the PCVD method.

In the step shown in FIG. 8B, the glass substrate 20 is subjected to heat treatment in an atmosphere of $N_2$ at 450° C. for 1 hour. After the hydrogen in the amorphous Si film 210a is removed, an excimer laser having a wavelength of 308 nm is applied to the amorphous Si film 210a at an energy density of 300 to 400 $mJ/cm^2$, more preferably 320 to 350 $mJ/cm^2$, thereby crystallizing the amorphous Si film 210a. As a result of the crystallization, the amorphous Si film 210a is converted into a polysilicon film 210p. If the proportion of hydrogen in the amorphous Si film 210a is less than 1%, the heat treatment in an atmosphere of $N_2$ can be skipped.

In the step shown in FIG. 8C, the polysilicon film 210p is patterned by the RIE method, so as to form the polysilicon pattern 21 shown in FIG. 7A. As described before, the polysilicon pattern 21 includes the short-circuiting pattern 21S.

In the step shown in FIG. 8D, a $SiO_2$ film 212 having a thickness of 100 to 150 nm, more preferably a thickness of approximately 120 nm, is deposited as a gate oxide film on the structure obtained in the step of FIG. 8C by the plasma CVD method in such a manner that the $SiO_2$ film 212 covers the polysilicon pattern 21. A gate electrode layer 22 made of an AlNd alloy having a thickness of 300 to 400 nm, more preferably a thickness of approximately 350 nm, is further deposited on the gate oxide film by sputtering.

In the step shown in FIG. 8E, the gate electrode layer 22 is patterned by wet etching using a resist mask, thereby forming the gate electrode pattern 22PG in the region of the p-channel TFT and the gate electrode pattern 22NG in the region of the n-channel TFT. With the resist mask remaining, the gate oxide film 212 is patterned by dry etching using $CHF_3$, thereby forming a gate oxide film pattern 212G corresponding to the gate electrode patterns 22PG and 22NG in the p-channel TFT region and the n-channel TFT region. In the step shown in FIG. 8E, after the patterning of the gate oxide film pattern 212G, the gate electrode patterns 22PG and 22NG are laterally etched by wet etching, with the resist mask remaining, so that the gate electrodes 22PG and 22NG become slightly smaller than the gate oxide film pattern 212G. As a result, the gate oxide film pattern 212G laterally protrudes from the side surfaces of the gate electrode patterns 22PG and 22NG by 0.5 to 1.5 $\mu$m, more preferably by 0.8 $\mu$m.

In the step shown in FIG. 8F, the resist mask is removed, and $P^+$ doping is carried out on the entire surface of the polysilicon pattern 21 in an atmosphere of 1% to 5% $PH_3$ diluted gas by the use of a plasma doping machine having RF discharge or DC discharge as an ion source. Here, a first doping with a dose of $5\times10^{14}$ to $1\times10^{15}$ $cm^{-2}$ is carried out at an acceleration voltage of 10 keV, and a second doping with a dose of $5\times10^{12}$ to $5\times10^{13}$ $cm^{-2}$ is carried out at an acceleration voltage of 70 keV. As a result, the n-channel TFT having an LDD structure is formed both in the p-channel TFT region and the n-channel TFT region on the polysilicon pattern 21. Accordingly, in the polysilicon pattern 21, the $n^+$-type source region 21NS and drain region 21ND are formed on both sides of the gate electrode pattern 22NG. As shown in FIG. 8F, an $n^-$-type LDD region is formed between the channel region 21NC and the source region 21NS or the drain region 21ND. In the state shown in FIG. 8F, $n^+$-type doping is uniformly performed on the polysilicon short-circuiting pattern 21S by the ion injection process.

In the step shown in FIG. 8G, a resist pattern RG is formed so as to cover the $n^+$-type region in the n-channel TFT region and the polysilicon short-circuiting pattern $21S_2$. $B^+$ ion injection in the two-step manner as described above is then carried out on the region not covered with the resist pattern RG in the polysilicon pattern 21. The $p^+$-type source region 21PS and the $p^+$-type drain region 21PD are formed on both sides of the gate electrode pattern 22PG, with a $p^-$-type LDD region being interposed therebetween. By the $B^+$ ion injection, $p^+$-type doping is carried out on the region $21S_1$ not protected by the resist pattern RG in the polysilicon short-circuiting pattern 21S. The $B^+$ ion injection is also carried out in existence of a 1% to 5% $B_2H_6$ diluted gas by the use of a plasma doping machine having RF discharge or DC discharge as an ion source. The first acceleration voltage is set at 10 keV, and the dose is set at $5\times10^{14}$ to $5\times10^{15}$ $cm^{-2}$. The second acceleration voltage is set at 60 keV, and the dose is set at $1\times10^{13}$ to $1\times10^{14}$ $cm^{-2}$. In the actual production procedure, after the step of injecting the $B^+$ ion shown in FIG. 8G, the resultant structure is subjected to heat treatment using an excimer laser or a halogen lamp. As a result, the P or B ions introduced in the step of FIG. 8F or FIG. 8G are activated in the polysilicon pattern 21. After the ion injection and heat treatment process, the source regions 21NS and 21PS, the drain regions 21ND and 21PD, and the $p^+$- and $n^+$-type short-circuiting patterns $21S_1$ and $21S_2$ are set at 5 k$\Omega$/□ or lower, more preferably at 1 k$\Omega$/□ or lower, in sheet resistance. Meanwhile, the sheet resistance of the $n^-$-type and $p^-$-type is set at $1\times10^4$ to $5\times10^6$ k$\Omega$/□, more preferably at $5\times10^4$ to $1\times10^6$ k$\Omega$/□.

In the step shown in FIG. 9A, an interlayer insulating film 23 made of SiN and having a thickness of 300 to 600 nm, more preferably, 400 nm, is deposited on the resultant structure of FIG. 8G by the plasma CVD method. The insulating film 23 is then patterned by the photolithographic method and the RIE method using $CF_4$ and $SF_6$, thereby forming the contact holes 23PS, 23PD, 23ND, and 23NS in the insulating film 23, as shown in FIG. 9A. Although not shown in the sectional view of FIG. 9A, the contact hole 23G is also formed at the same time as the formation of the contact holes 23PS, 23PD, 23ND, and 23NS.

In the step shown in FIG. 9A, the opening 23S is further formed in the insulating film 23, so that the short-circuiting pattern 21S is exposed through the opening 23S.

In the step shown in FIG. 9B, a conductive film 24 having an Al layer having a thickness of 20 nm and a Ti layer having a thickness of 10 nm is formed on the resultant structure of FIG. 9A by sputtering, so that the contact holes 23PS, 23PD, 23ND, and 23NS, as well as the opening 23S, are filled with the conductive film 24.

In the step shown in FIG. 9C, the conductive film 24 is patterned by the RIE process using an etching gas, thereby producing the source electrodes 24PS and 24NS, the common drain electrode 24D, and the gate wiring pattern 24G. Further, in the step shown in FIG. 9C, the conductive film 24 is removed from the opening 23S, thereby exposing the polysilicon short-circuiting pattern 21S. With the resist pattern remaining, the polysilicon short-circuiting pattern 21S is subjected to dry etching by the RIE process. As a result, the polysilicon short-circuiting pattern 21S is cut at the opening 23S.

In the step shown in FIG. 9D, an insulating film 25 made of SiN and having a thickness of approximately 350 nm is formed on the resultant structure of the step shown in FIG. 9C. Thus, a desired TFT-CMOS circuit is completed.

In a case where the desired TFT-CMOS circuit is a driving circuit of a liquid-crystal display device, a pixel electrode forming process is performed on the insulating film 25, as will be described in the next embodiment.

Third Embodiment

Figure 10:
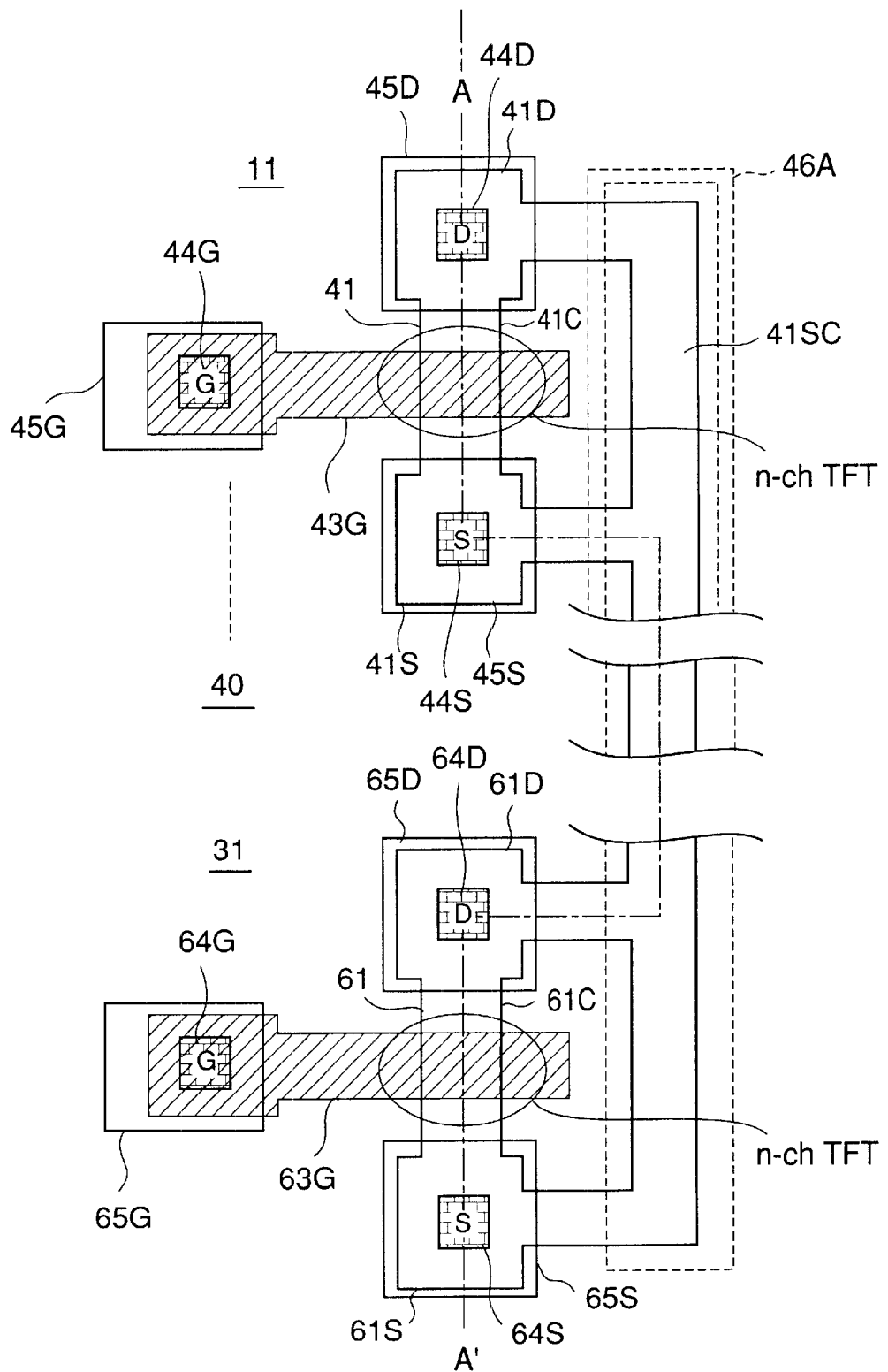
FIG. 10 shows the structure of a pixel TFT of a liquid-crystal display device in accordance with a third embodiment of the present invention.

In the following, a method of producing a liquid-crystal display device in accordance with a third embodiment of the present invention will be described with reference to FIGS. 10, 11A to 11D, and 12A to 12C. FIG. 10 is a plan view of a TFT substrate halfway through production.

As shown in FIG. 10, a polysilicon pattern 41 that constitutes the pixel TFT 11 and a polysilicon pattern 61 that constitutes a peripheral circuit TFT 31 are formed on a TFT glass substrate 40 equivalent to the TFT glass substrate 1A of FIG. 1. The polysilicon pattern 41 includes an n⁺-doped source region 41S, an n⁺-doped drain region 41D, and a channel region 41C that connects the source region 41S and the drain region 41D. Accordingly, the pixel TFT 11 is an n-channel TFT.

Likewise, the polysilicon pattern 61 includes an n⁺-doped source region 61S, an n⁺-doped drain region 61D, and a channel region 61C that connects the source region 61S and the drain region 61D. Accordingly, the polysilicon pattern 61 forms the peripheral circuit, for instance, a part of the n-channel TFT that constitutes the signal-side peripheral circuit 12B shown in FIG. 4.

The polysilicon patterns 41 and 61 are covered with a gate oxide film 42 (not shown in the plan view of FIG. 10) formed on the glass substrate 40. On the gate oxide film 42, a gate electrode 43G is formed so as to cover the channel region 41C, and a gate electrode 63G is formed so as to cover the channel region 61C. Further, the gate electrodes 43G and 63G, and the polysilicon patterns 41 and 61 are covered with an interlayer insulating film 44 (not shown in the plan view of FIG. 10). On the interlayer insulating film 44, a source electrode 45S corresponding to the source region 41S, a drain electrode 45D corresponding to the drain region 41D, a source electrode 65S corresponding to the source region 61S, and a drain electrode 65D corresponding to the drain region 61D are formed in such a manner that the source electrode 45S, the drain electrode 45D, the source electrode 65S, and the drain electrode 65D are brought into contact with the corresponding source regions 41S and 61S, and the drain regions 41D and 61D, through contact holes 44S, 44D, 64S, and 64D formed in the interlayer insulating film 44. Also, on the interlayer insulating film 44, gate electrode patterns 45G and 65G corresponding to the gate electrodes 43G and 63G are formed in such a manner that the gate electrode patterns 45G and 65G are brought into contact with the gate electrodes 43G and 63G through contact holes 44G and 64G formed in the interlayer insulating film 44.

In FIG. 10, the drain region 41D, the source region 41S, the drain region 61D, and the source region 61S are short-circuited by a polysilicon short-circuiting pattern 41SC formed on the glass substrate 40. Because of this, no potential difference will be caused inside the TFT 11 and the TFT 31, if plasma processing is performed during the step of depositing the interlayer insulating film 44, the step of patterning the contact holes 44S, 64S, 44D, 64D, 44G, and 64G in the insulating film 44, or the step of patterning the electrode patterns 45S, 65S, 45D, 65D, 45G, and 65G.

In this embodiment, with the polysilicon short-circuiting pattern 41SC, another interlayer insulating film 46 (not shown in the plan view of FIG. 10) is formed so as to cover the source electrodes 45S and 65S, and the drain electrodes 45D and 65D. On the interlayer insulating film 46, a transparent pixel electrode is formed in such a manner that the transparent pixel electrode is in contact with the drain region 41D of the TFTs 11. At this point, the polysilicon short-circuiting pattern 41SC is removed through an opening 46A formed in the interlayer insulating film 46. Thus, the problem of short-circuiting due to the polysilicon short-circuiting pattern 41SC can be eliminated.

FIGS. 11A to 12C illustrate the steps of producing the liquid-crystal display device of the third embodiment of the present invention. Each of FIGS. 11A to 12C is a sectional view of the liquid-crystal display device taken along the line A–A' in FIG. 10.

As shown in FIG. 11A, after the formation of the TFTs 11 and 31, the polysilicon pattern 41 is covered with the SiN interlayer insulating film 44 having a thickness of 300 to 600 nm, more preferably 400 nm, formed by the plasma CVD method. In the step shown in FIG. 11B, the contact holes 44S, 64S, 44D, and 64D for exposing the source regions 41S and 61S, and the drain regions 41D and 61D, respectively, are formed in the interlayer insulating film 44. In the step of forming the contact holes, an opening 44A for exposing the polysilicon short-circuiting pattern 41SC is formed at the same time. The TFT 11 and 31 have the LDD structure, like the TFT described in the foregoing embodiments.

In the step shown in FIG. 11C, a conductive film 45 having a Ti/Al/Ti stacked structure is deposited on the interlayer insulating film 44 by sputtering, so that the contact holes 44S, 64S, 44D, 64D, and the opening 44A are filled with the conductive film 45. In the step shown in FIG. 11D, the conductive film 45 is patterned by the RIE process using a mixed gas of $CF_4$, $SF_6$, and $O_2$ as an etching gas, thereby forming the source electrodes 45S and 65S, and the drain electrodes 45D and 65D. Although the gate contact holes 44G and 64G cannot be seen on the section taken along the line A–A' in FIGS. 11C and 11D, they are included in the sectional view of FIGS. 11C and 11D for ease of explanation. After the patterning of the conductive film 45, the gate wiring patterns 45G and 65G are formed on the contact holes 44G and 64G.

In the step shown in FIG. 11D, at the time of the patterning of the conductive film 45, the conductive film 45 is removed through the opening 44A, thereby exposing the polysilicon short-circuiting pattern 41SC through the opening 44A. Unlike the foregoing embodiment, the polysilicon short-circuiting pattern 41SC is not cut in the step of FIG. 11D in this embodiment.

In the step shown in FIG. 12A, a SiN interlayer insulating film 46 having a thickness of 300 to 500 nm, more preferably 350 nm, is formed on the resultant structure of FIG. 11D by the plasma CVD method. In this interlayer insulating film 46, the opening 46A for exposing the opening 44A and a contact hole 46B for exposing the drain electrode 45D are formed. In this embodiment, the polysilicon short-circuiting pattern 41SC is cut through the opening 44A in the step of forming the opening 46A. As a result, the polysilicon short-circuiting pattern 41SC is divided into a polysilicon pattern 41SC₁ that extends from the peripheral circuit TFT 31 to the opening 44A, and a polysilicon pattern 41SC₂ that extends from the pixel TFT 11 to the opening 44A.

In this embodiment, prior to the deposition of the interlayer insulating film 46 by the plasma CVD method in the step of FIG. 12A, the TFT 31 and the TFT 11 are electrically disconnected from each other by the polysilicon short-circuiting pattern 41SC. Accordingly, there is no possibility of electrostatic damage in the TFT 31 or TFT 11, even if plasma processing induces internal charges.

In the step shown in FIG. 12B, a transparent pixel electrode 47 made of ITO ($In_2O_3 \cdot SnO_2$) is formed on the interlayer insulating film 46 in such a manner that the transparent pixel electrode 47 is brought into contact with the drain electrode 45D through the contact hole 46B. In the step shown in FIG. 12C, a molecular orientation film 48 is formed on the interlayer insulting film 46 by spin coating in such a manner that the molecular orientation film 48 covers the transparent pixel electrode 47.

As described before, since the polysilicon short-circuiting pattern 41SC is cut after the formation of the interlayer insulating film 46, there is no possibility that electrostatic damage is caused in the TFT 31 or TFT 11 even though the interlayer insulating film 46 is formed by the plasma CVD method.

Fourth Embodiment

Figures 13A, 13B, 13C:
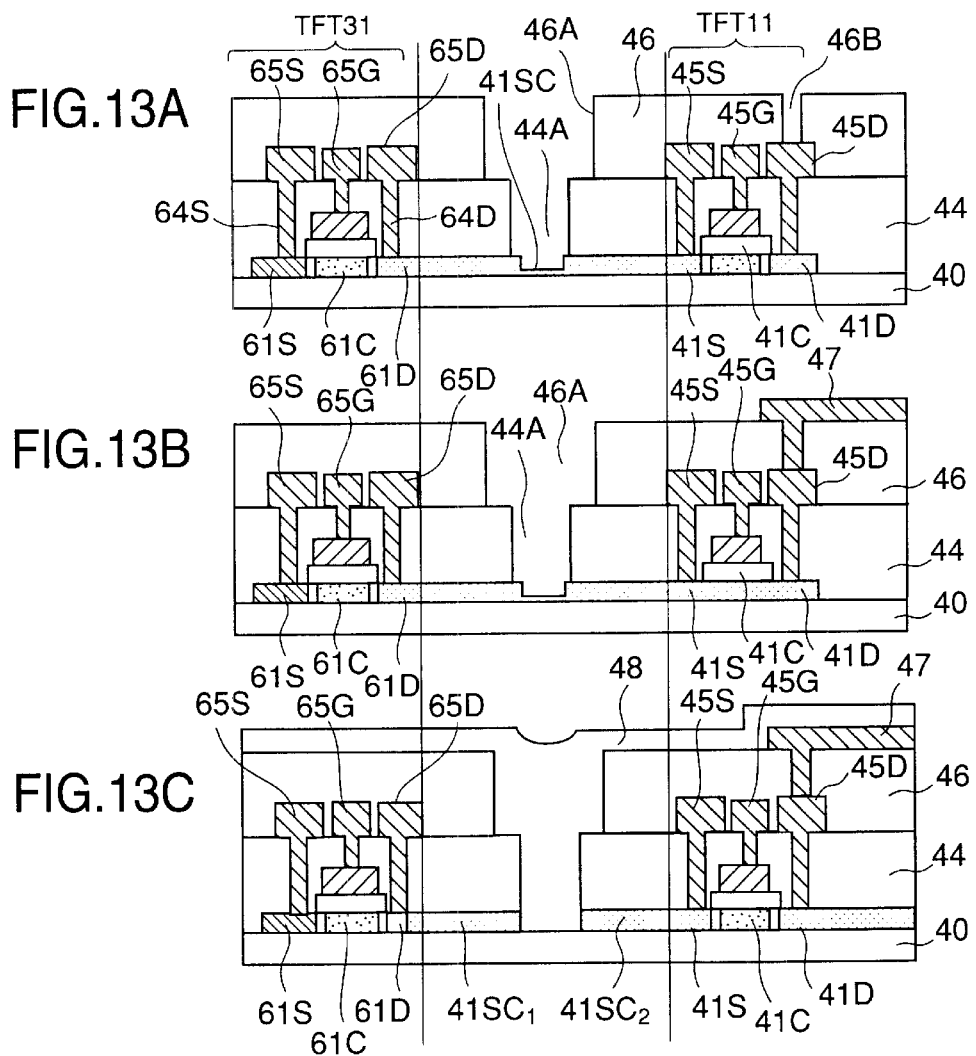
FIGS. 13A to 13C illustrate the steps of producing a liquid-crystal display device comprising a pixel TFT in accordance with a fourth embodiment of the present invention.

FIGS. 13A to 13C illustrate the steps of producing a liquid-crystal display device in accordance with a fourth embodiment of the present invention. It should be noted that the step shown in FIG. 13A is a step that follows the step shown in FIG. 11D of the third embodiment, and is equivalent to the step shown in FIG. 12A. In FIGS. 13A to 13C, the same components as in the third embodiment are denoted by the same reference numerals.

As shown in FIG. 13A, when the opening 46A is formed in the interlayer insulating film 46 by the RIE process, dry etching is performed under such conditions that the polysilicon short-circuiting pattern 41SC is not fully removed. As a result, the polysilicon short-circuiting pattern 41SC is exposed through the opening 44A exposed through the opening 46A.

In the step shown in FIG. 13B, the transparent pixel electrode 47 is deposed on the interlayer insulating film 46 by the plasma CVD method using the ITO layer, and then patterned by the RIE process. In FIG. 13C, which is equivalent to the step shown in FIG. 12C, the polysilicon short-circuiting pattern 41SC is cut through the opening 44A. After the cutting, the molecular orientation film 48 is formed on the interlayer insulating film 46 in such a manner that the molecular orientation film 48 covers the transparent pixel electrode 47.

In this embodiment, an additional step is required for cutting the polysilicon short-circuiting pattern 41SC as shown in FIG. 13C. However, this step is performed after the formation of the transparent pixel electrode 47. Accordingly, the possibility of electrostatic damage in the TFT 11 or TFT 31 during the production of the liquid-crystal display device can be eliminated.

Fifth Embodiment

Figure 14:
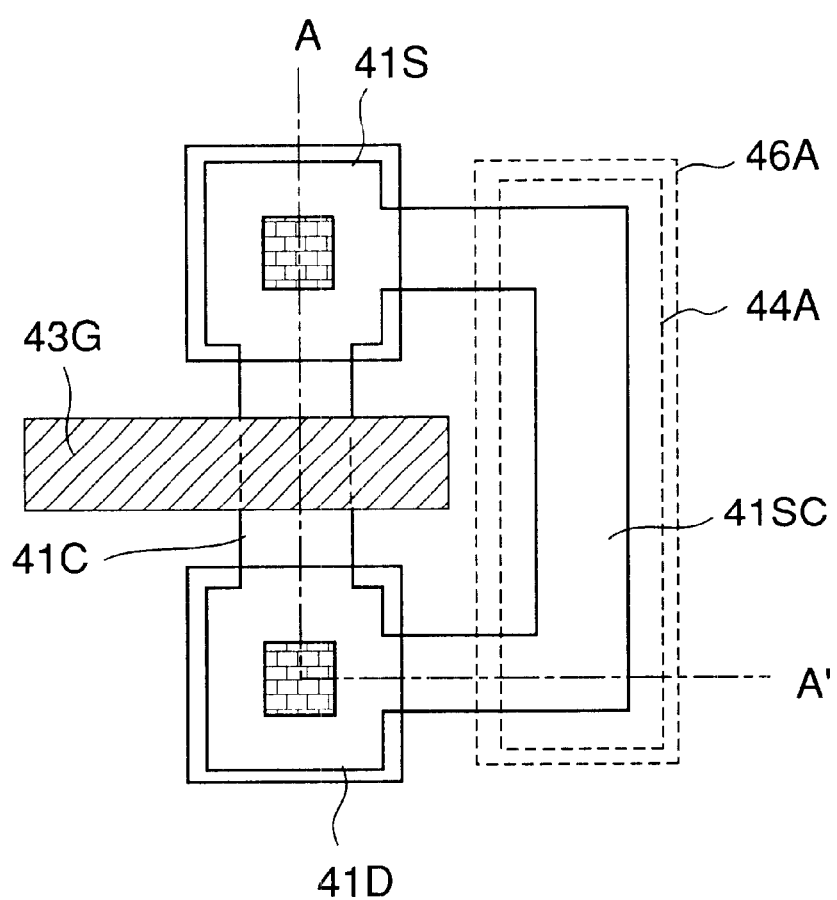
FIG. 14 shows the structure of a pixel TFT in accordance with a fifth embodiment of the present invention.

In the foregoing embodiments, damage in the TFT is avoided by the polysilicon short-circuiting pattern 41SC connecting the pixel TFT 11 and the peripheral circuit TFT 31 during the production of the liquid-crystal display device. However, it is also possible to form a polysilicon short-circuiting pattern in each pixel TFT 11 in the display region as shown in FIG. 14. In FIG. 14 the same components as described before are denoted by the same reference numerals.

As shown in FIG. 14, each of the TFTs 11 arranged in the display region of the liquid-crystal display device includes the $n^+$- or $p^+$-type source region 41S, the drain region 41D having the same conductivity, and the polysilicon pattern 41SC that short-circuits the source region 41S and the drain region 41D. The polysilicon short-circuiting pattern 41SC is exposed through the opening 44A and the opening 46A, which also exposes the opening 44A. After the step of forming a contact hole for the transparent pixel electrode 47 in the interlayer insulating film 46, which step is equivalent to the step shown in FIG. 12A, or after the patterning of the transparent pixel electrode 47, the polysilicon short-circuiting pattern 41SC is cut. Particularly, in the case where the polysilicon short-circuiting pattern 41SC is cut after the formation of patterning of the transparent pixel electrode 47, even a great potential difference induced between the source region 41S and the drain region 41D due to the antenna effect during the patterning by the RIE process can be immediately eliminated by the polysilicon short-circuiting pattern 41SC. Thus, electrostatic damage in the TFTs 11 can be avoided.

Sixth Embodiment

In the following, another embodiment of the present invention applied to a TFT substrate of a liquid-crystal display device will be described.

Figure 15:
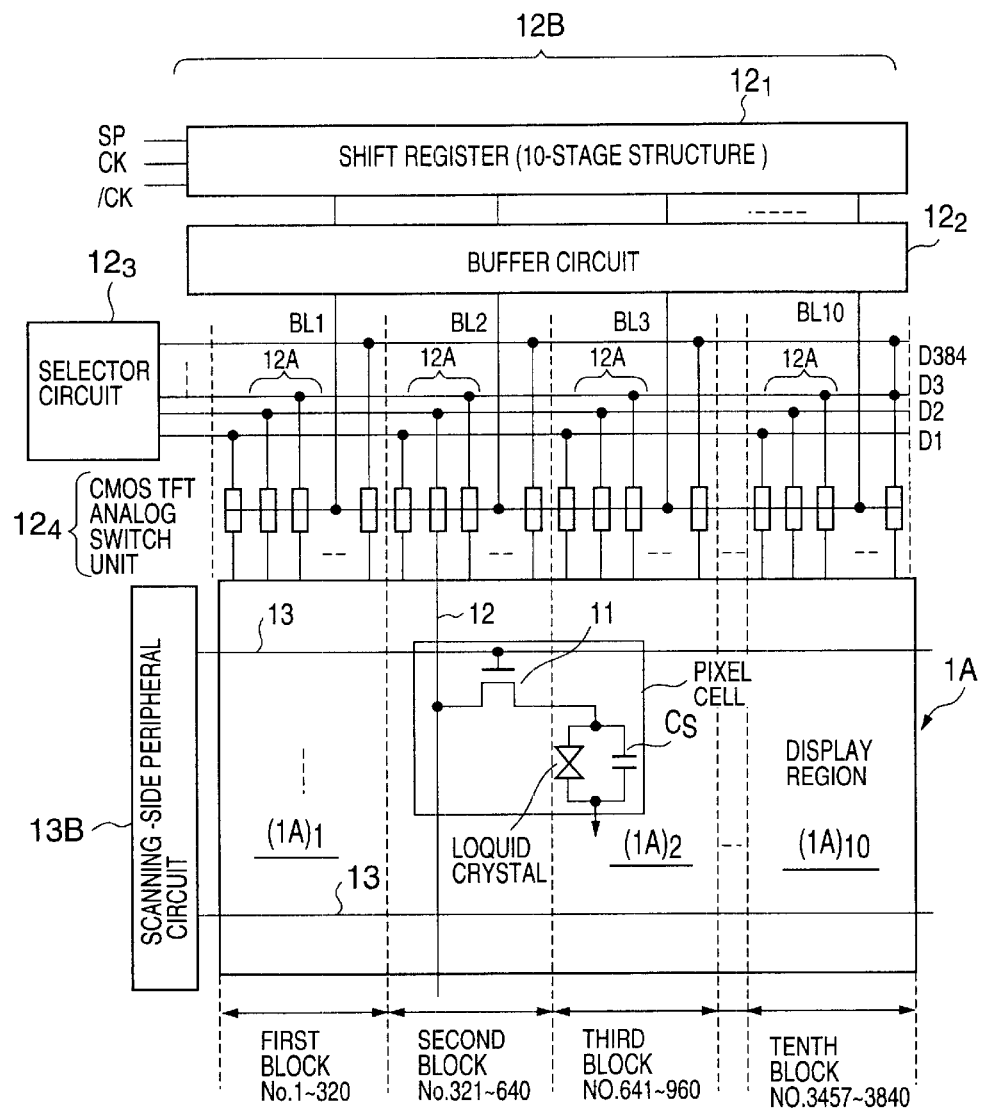
FIG. 15 shows the structure of a peripheral circuit of a liquid-crystal display device in accordance with a sixth embodiment of the present invention.

FIG. 15 shows the structure of a TFT substrate of a liquid-crystal display device in accordance with a sixth embodiment of the present invention. In FIG. 15, the same components as in the foregoing embodiments are denoted by the same reference numerals.

As shown in FIG. 15, the display region on the TFT substrate 1A is divided into a plurality of regions $(1A)_1$ to $(1A)_{10}$. The signal-side peripheral circuit 12B is externally attached to the TFT glass substrate 1A, and includes a shift register $12_1$ having the same number of stages as the regions $(1A)_1$ to $(1A)_{10}$, a buffer circuit $12_2$ that receives an output signal from each of the stages of the shift register $12_1$, and a selector circuit $12_3$ that selects a signal line 12 among the plurality of regions $(1A)_1$ to $(1A)_{10}$. The output of each stage of the shift register $12_1$ is supplied to an analog switch circuit $12_4$ constituted by TFT-CMOS circuits connected to the respective signal lines 12. In accordance with a selected signal from the selector circuit $12_3$, the analog switch circuit $12_4$ supplies the output signal of the shift register $12_1$ to the selected signal line 12 for each of the regions $(1A)_1$ to $(1A)_{10}$.

Additionally, the scanning-side peripheral circuit 13B is formed on the TFT substrate 1A in the structure shown in FIG. 15.

Figure 16:
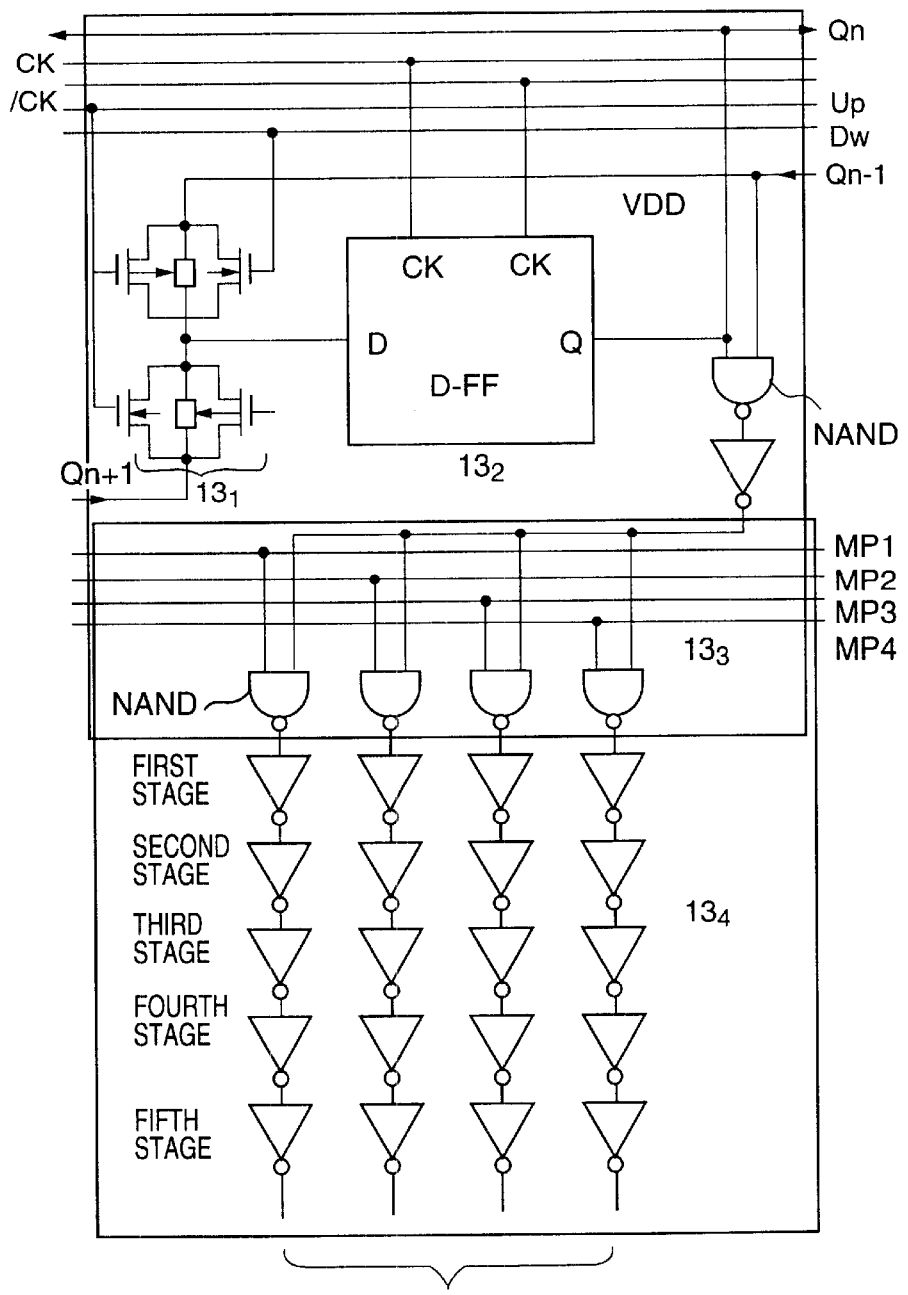
FIG. 16 is a detail view of a scanning-side peripheral circuit of the liquid-crystal display of FIG. 15.

FIG. 16 shows the structure of the scanning-side peripheral circuit 13B of the sixth embodiment of the present invention.

As shown in FIG. 16, the scanning-side peripheral circuit 13B comprises a bidirectional switch unit $13_1$ that combines a p-channel TFT and an n-channel TFT; a shift register unit $13_2$ that consists of a D-type flip-flop, a NAND gate, and an inverter; a multiplexer unit $13_3$ constituted by NAND gate; and an output buffer circuit $13_4$ constituted by inverters. In the p-channel TFT and the n-channel TFT that constitute the bidirectional switch unit $13_1$, an internal short-circuiting pattern equivalent to the polysilicon short-circuiting pattern 21SC or 41SC of the foregoing embodiments is formed so as to short-circuit the source region and the drain region.

Figure 17:
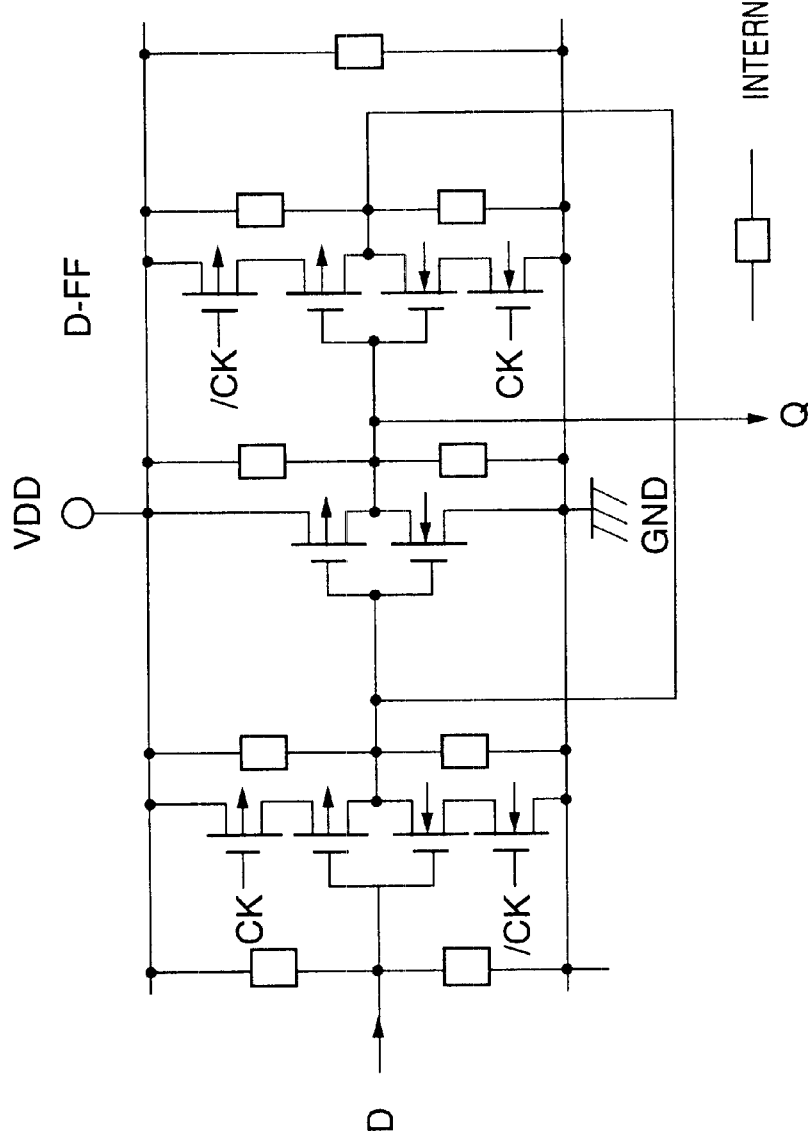
FIG. 17 is a detail view of a D-type flip-flop of the structure shown in FIG. 16.

FIG. 17 shows the structure of the D-type flip-flop in FIG. 16.

As shown in FIG. 17, the D-type flip-flop includes TFT-CMOS circuits described in the foregoing embodiments. In each of the TFT that constitute each TFT-CMOS circuit, a short-circuiting pattern equivalent to the polysilicon short-circuiting pattern 21SC or 41SC is formed so as to short-circuit the source and the drain.

Figure 18:
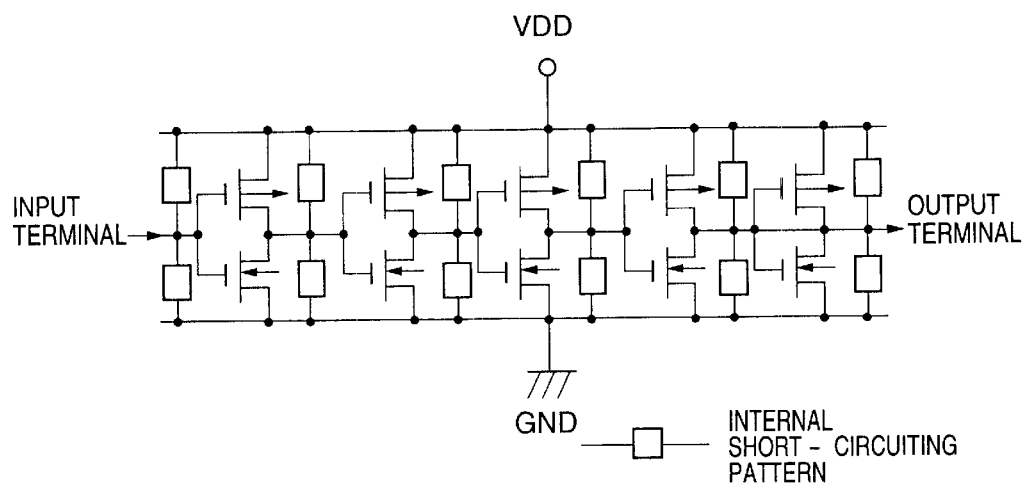
FIG. 18 is a detail view of an output buffer circuit of the structure shown in FIG. 16.

FIG. 18 shows a part of the output buffer unit $13_4$ in the structure shown in FIG. 16.

As shown in FIG. 18, the output buffer unit 13₄ also includes TFT-CMOS circuits described in the foregoing embodiments. In each of the TFT that constitute each TFT-CMOS circuit, a short-circuiting pattern equivalent to the polysilicon short-circuiting pattern 21SC or 41SC is formed between the source and the drain.

Figure 19:
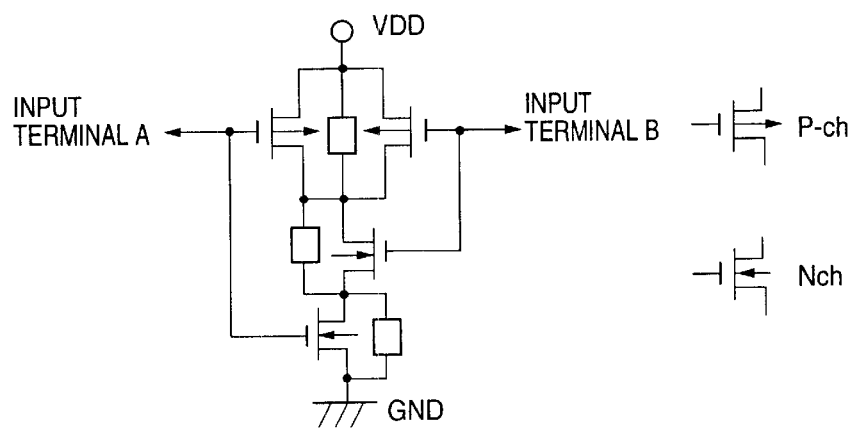
FIG. 19 is a detail view of a NAND circuit of the structure shown in FIG. 16.

FIG. 19 shows the structure of the NAND circuit in the structure shown in FIG. 16.

As shown in FIG. 19, a short-circuiting pattern equivalent to the polysilicon short-circuiting pattern 21SC and 41SC is also formed between the source and drain in each of the p-channel TFTs and n-channel TFT that constitute the NAND circuit.

Figure 20:
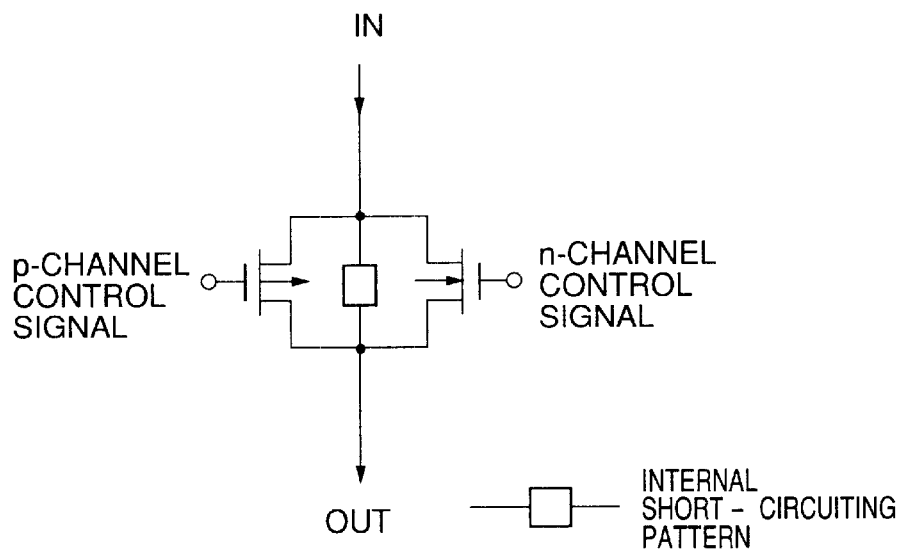
FIG. 20 is a detail view of an analog switch circuit of the structure shown in FIG. 15.

FIG. 20 shows the structure of the analog switch circuit 12₄ in the structure shown in FIG. 15.

As shown in FIG. 20, in each of the p-channel TFTs and the n-channel TFT that constitute the analog switch circuit 12₄, a short-circuiting pattern equivalent to the polysilicon short-circuiting pattern 21SC or 41SC of the foregoing embodiments is formed between the source and drain.

Figure 4:
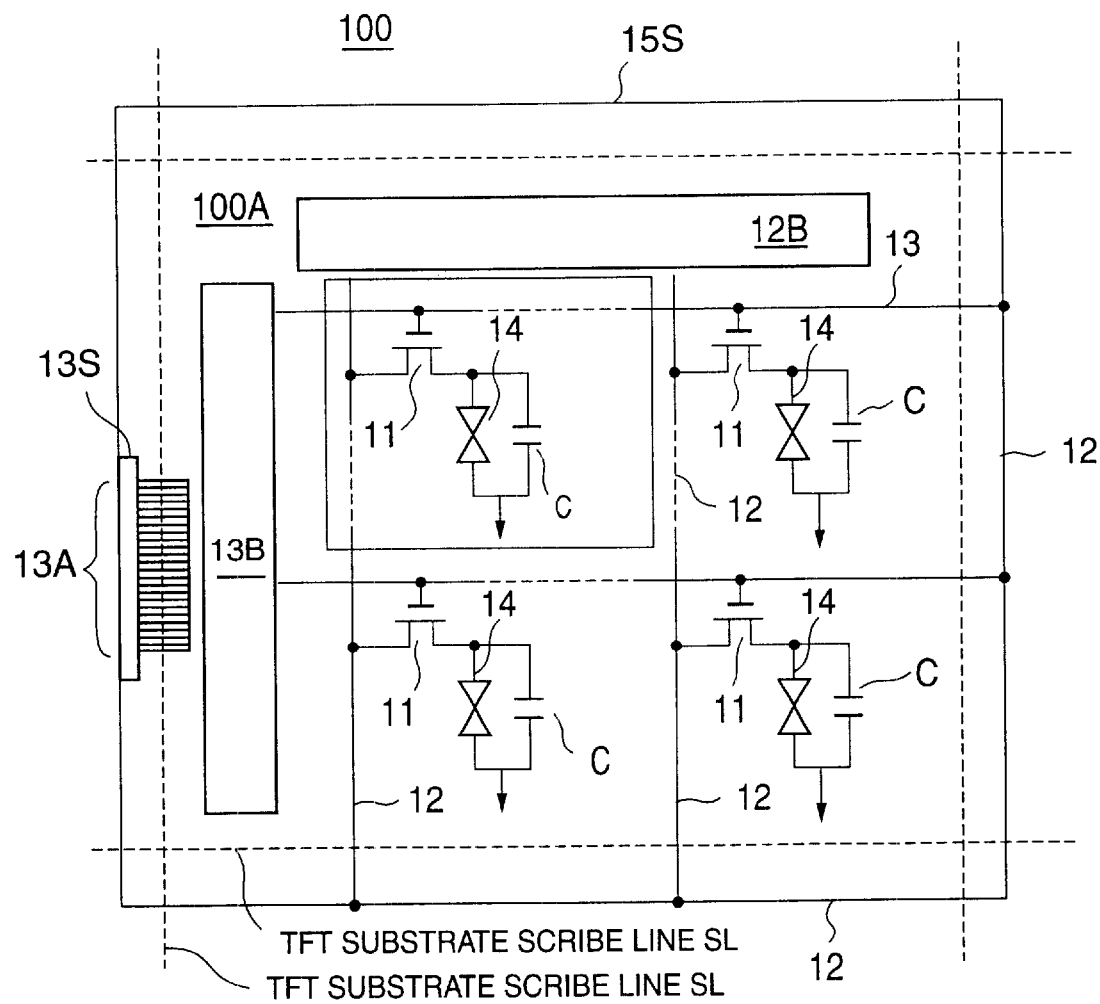
FIG. 4 illustrates a conventional antistatic structure in a TFT substrate shown in FIG. 3.
Figure 21:
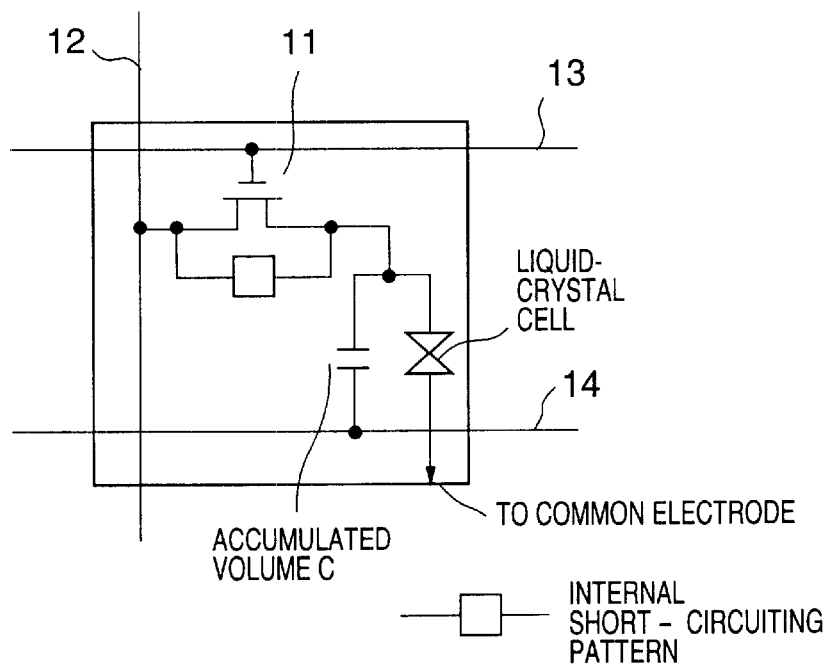
FIG. 21 is a detail view of a memory cell of the structure of FIG. 15.

FIG. 21 shows the structure of a memory cell equivalent to the structure shown in FIG. 4.

As shown in FIG. 21, a short-circuiting pattern similar to the polysilicon short-circuiting pattern 21SC or 41SC of the foregoing embodiments is formed between the source and drain of the pixel TFT 11.

In the structures shown in FIGS. 16 to 21, each short-circuiting pattern is removed at the same time as or after the formation of the wiring pattern in the TFTs.

Seventh Embodiment

Figure 5A:
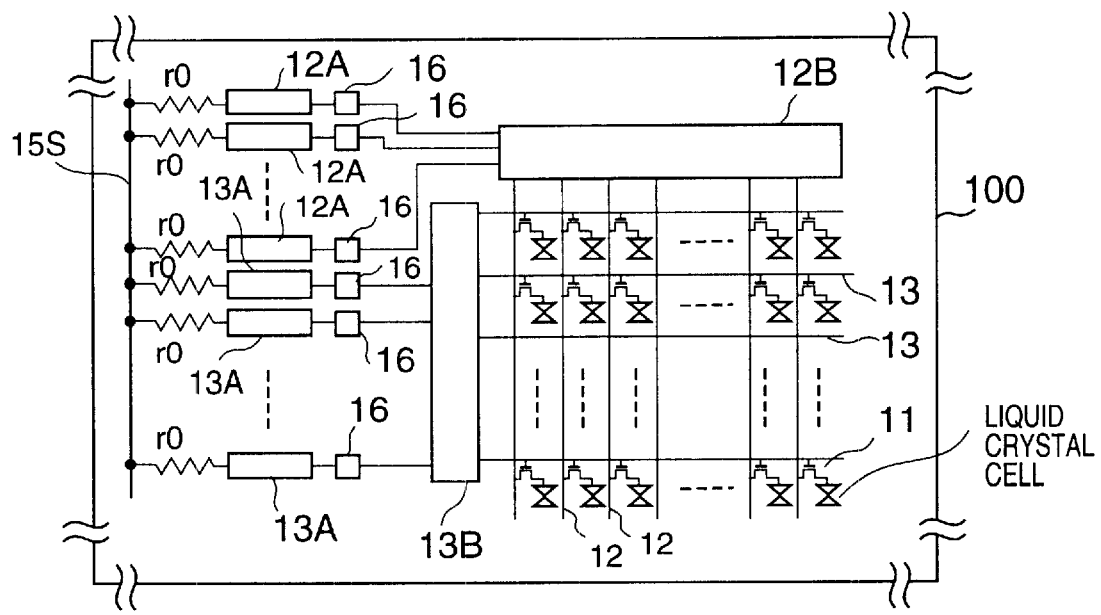
FIGS. 5A to 5C illustrate another antistatic structure in the TFT substrate shown in FIG. 3.
Figure 5B:
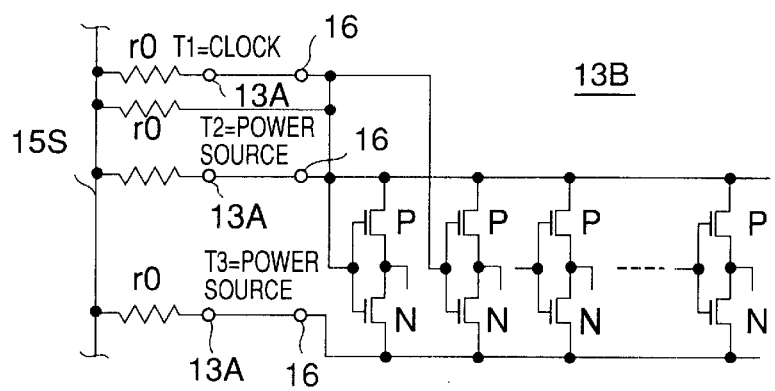
Figure 5C:
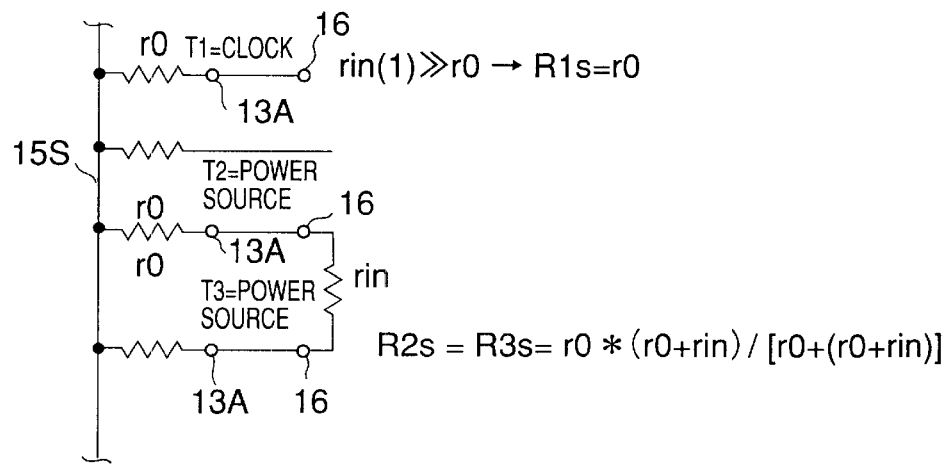

As described with reference to FIGS. 5A to 5C, during the production of a liquid-crystal display device, a resistance element $r_0$ is interposed between each of the connection pads 12A and 13A and a peripheral short-circuiting ring 15S so as to enable the testing of the TFT substrate being produced. In this structure, however, if there is a difference in internal resistance between the connection pads 12A and 13A, a potential difference is caused in each connection pad, resulting in electrostatic damage of the TFT constituting the internal circuit connected to the connection pads.

Figure 22:
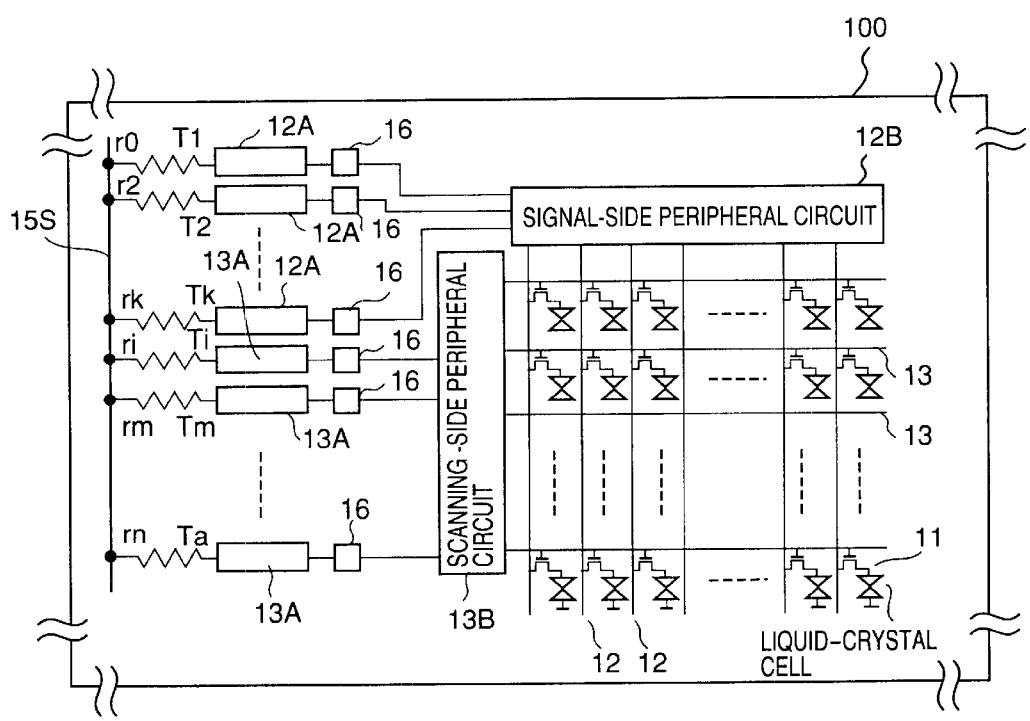
FIG. 22 shows the structure of a liquid-crystal display device in accordance with a seventh embodiment of the present invention.
Figure 23:
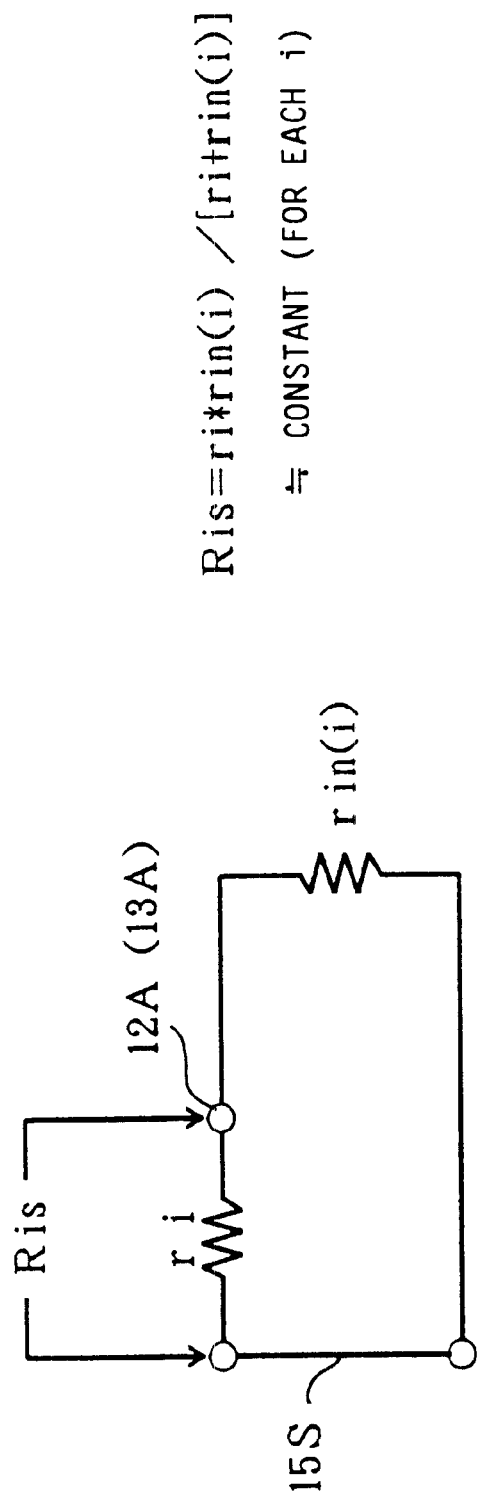
FIG. 23 illustrates the principles of the seventh embodiment of the present invention.

To avoid such a problem, a resistance value of each resistance element that connects the connection pads 12A and 13A to the peripheral short-circuiting ring 15S, as shown in FIG. 22, is varied depending on the internal resistance value of the internal circuit connected to each of the connection pads 12A and 13A, so that the apparent resistance $R_{is}$ becomes constant in the connection pads 12A and 13A, as shown in FIG. 23.

As shown in FIG. 23, the apparent resistance value $R_{is}$ is represented as $$R_{is}=r_i \times r_{in}(i)/[r_i+r_{in}(i)]$$

where the value of the internal resistance of the internal circuit connected to the connection pads 12A and 13A is $r_{in}$(i) (i=1, 2, 3, . . . ), and $r_i$ represents the resistance value of each resistance element interposed between the peripheral short-circuiting ring 15S and the connection pads 12A and 13A. In this embodiment, the value $R_{is}$ is set as a common value among the connection pads 12A and 13A.

Figure 24:
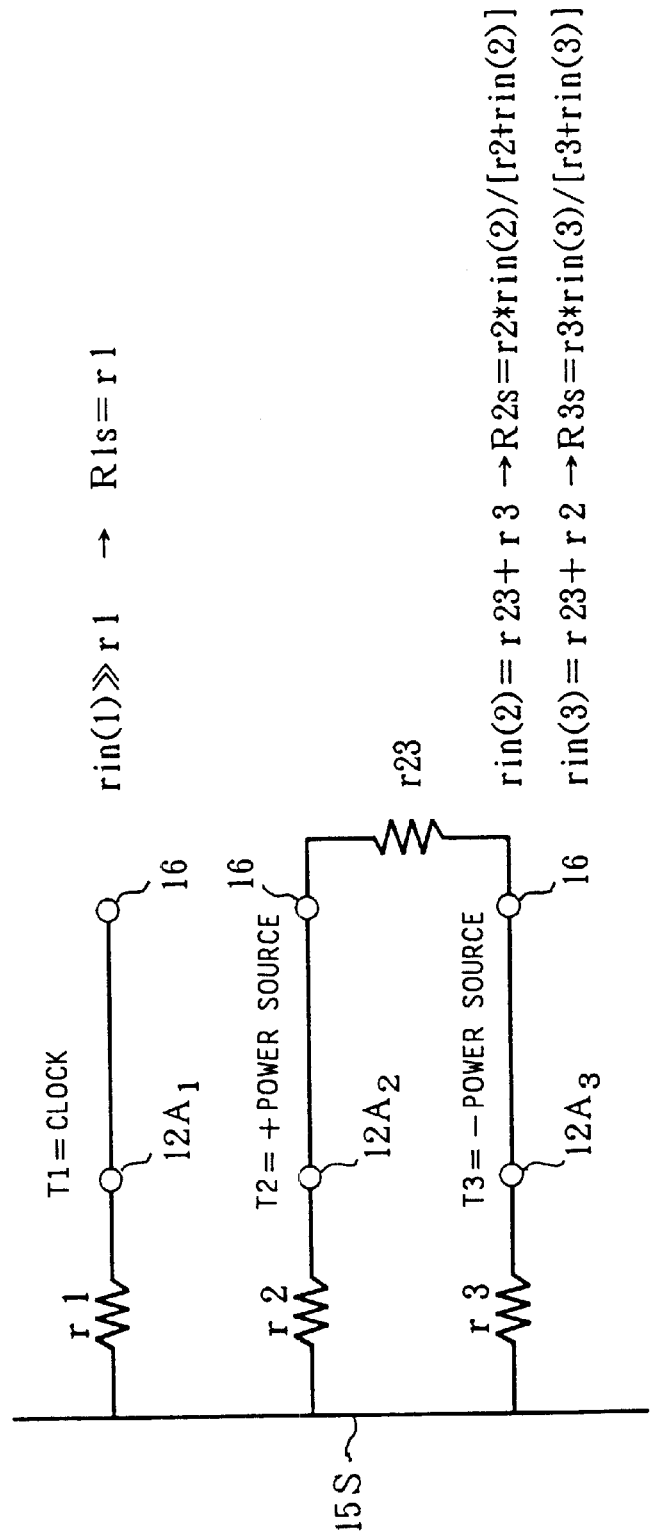
FIG. 24 illustrates an example structure of the seventh embodiment of the present invention.

FIG. 24 shows the structure of FIG. 23 in greater detail.

As shown in FIG. 24, a resistance element having a resistance value $r_1$ is interposed between a contact pad 12A₁ and the peripheral short-circuiting ring 15S. Since the internal circuit, to which the contact pad 12A₁ is connected, has a great input impedance $r_{in}$(1) ($r_{in}$(1)>$r_1$), the apparent resistance value $R_{1s}$ at the contact pad 12A₁ is substantially equal to the value $r_1$ ($R_{1s}$=$r_1$).

On the other hand, the value $r_{23}$ of the internal resistance between a contact pad 12A₂ and a contact pad 12A₃ is smaller than the value $r_{in}$(1). Accordingly, the apparent resistance values $R_{2s}$ and $R_{3s}$ at the contact pads 12A₂ and 12A₃ are represented as follows:

$$R_{2s}=r_2 \times r_{in}(2)/[r_2+r_{in}(2)]$$

$$R_{3s}=r_3 \times r_{in}(3)/[r_3+r_{in}(3)]$$

where $r_{in}$(2)=$r_{23}$+$r_3$, and $r_{in}$(3)=$r_{23}$+$r_2$. The resistance values of the resistance elements $r_2$ and $r_3$ are set so that the values of $R_{2s}$ and $R_{3s}$ become equal to the value $R_{1s}$.

Figure 25:
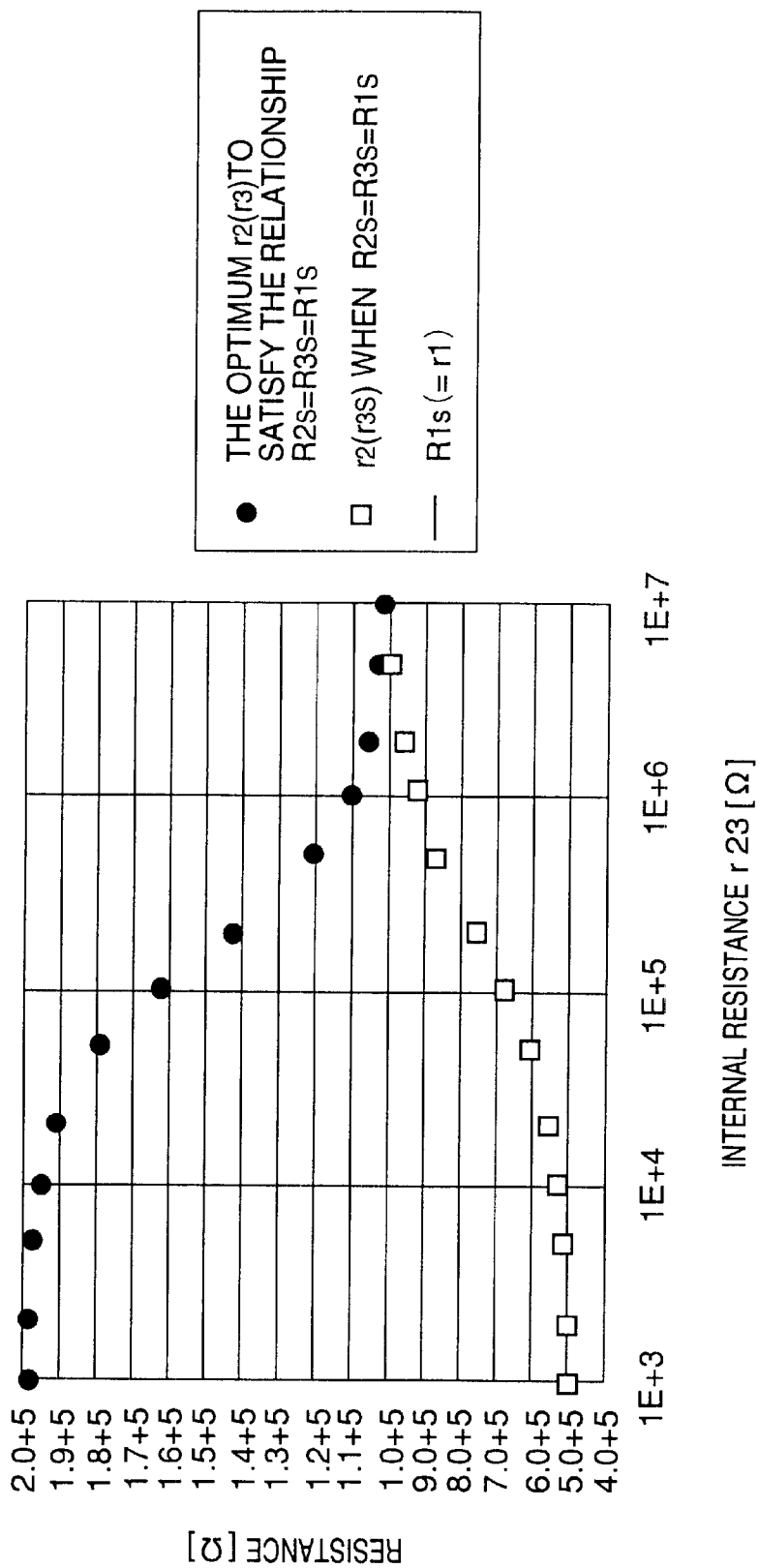
FIG. 25 illustrates the optimization of resistance value in accordance with the seventh embodiment of the present invention.

FIG. 25 shows the optimum setting of the resistance values of the resistance elements $r_2$ and $r_3$.

In FIG. 25, the optimum values of the resistance elements $r_2$ and $r_3$ to satisfy the condition $R_{2s}$=$R_{3s}$=$R_{1s}$ (=1.0×10⁵Ω) are represented by solid circles ● in the form of a function of the internal resistance $r_{23}$. On the other hand, squares □ represent a conventional case where the resistance elements $r_1$, $r_2$, and $r_3$ have the same resistance value, as in the case shown in FIGS. 5A to 5C.

As shown in FIG. 25, if the value of the internal resistance $r_{23}$ is great, the difference between this embodiment and the prior art is very small. However, if the value of the internal resistance $r_{23}$ is small, the difference between this embodiment and the prior art is great. In a liquid-crystal display device that includes TFT-CMOS circuits, the difference in resistance value is a serious problem. In this embodiment, however, such a problem can be effectively eliminated.

Eighth Embodiment

Figure 26:
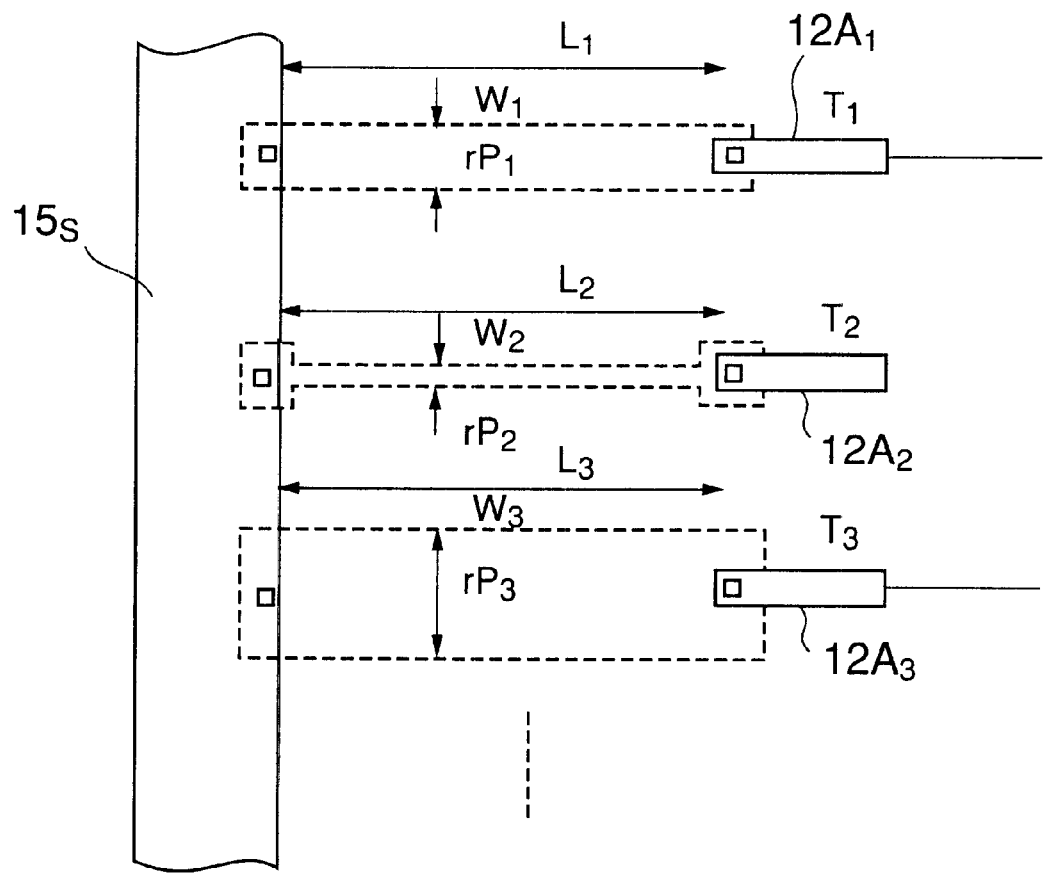
FIG. 26 illustrates the principles of an eighth embodiment of the present invention.

FIG. 26 shows example structures of resistance elements $r_1$ to $r_n$ in the liquid-crystal display device of FIG. 7, in accordance with an eighth embodiment of the present invention.

As shown in FIG. 26, each resistance element is made up of conductive polysilicon patterns rp₁, rp₂, rp₃, . . . connected to the peripheral short-circuiting ring 15S. The polysilicon pattern rp, has a length L₁ and a width W₁. Likewise, the polysilicon pattern rp₂ has a length L₂ and a width W₂, and the polysilicon pattern rp₃ has a length L₃ and a width W₃.

In FIG. 26, the lengths L₁, L₂, and L₃ are the same while the widths W₁, W₂, and W₃ are varied, due to the positional relationship between the peripheral short-circuiting ring 15S and the contact pads 12A₁ to 12A₃. In this embodiment, the widths W₁, W₂, and W₃ are set so that the polysilicon patterns rp₁ to rp₃ satisfy the relationship shown in FIG. 25.

Ninth Embodiment

Figure 27A:
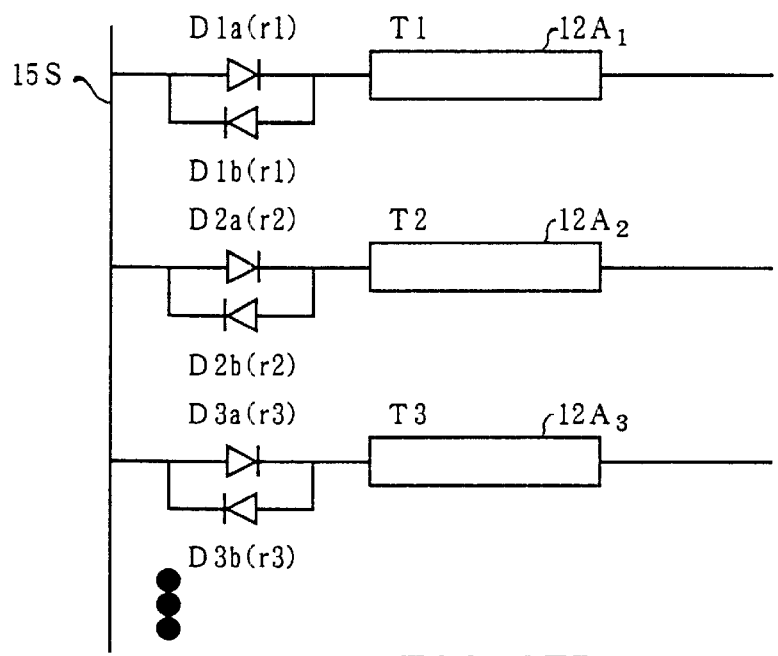
FIGS. 27A and 27B illustrate the principles of a ninth embodiment of the present invention.

FIG. 27A shows the structures of resistance elements $r_1$ to $r_n$ in accordance with a ninth embodiment of the present invention.

As shown in FIG. 27A, the resistance element $r_1$ comprises diodes $D_{1a}$ and $D_{1b}$ that are arranged in opposite directions and connected in parallel to each other. Likewise, the resistance element $r_2$ comprises diodes $D_{2a}$ and $D_{2b}$ that are arranged in opposite directions and connected in parallel to each other. In addition, the resistance element $r_3$ comprises diodes $D_{3a}$ and $D_{3b}$ that are arranged in opposite directions and connected in parallel to each other. With the resistance elements $r_1$ to $r_3$, the setting of the resistance values $R_1$, $R_2$, and $R_3$ described with reference to FIG. 25 can be achieved by the structure shown in FIGS. 28A and 28B.

Figure 28A:
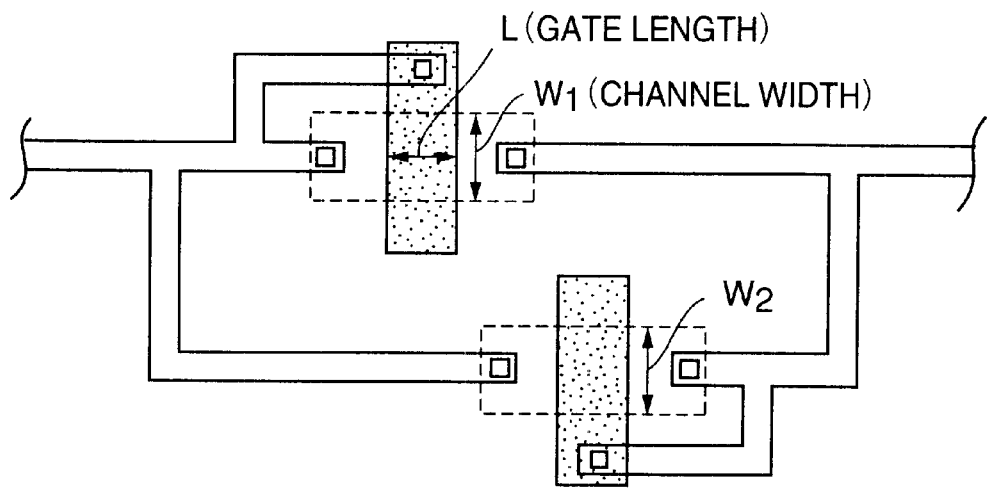
FIGS. 28A and 28B illustrate another example structure of the ninth embodiment of the present invention.
Figure 28B:
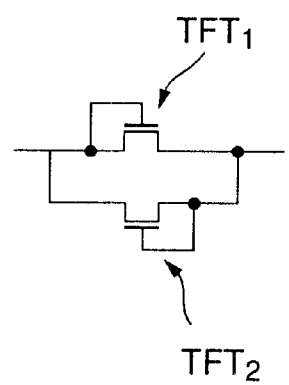

As shown in an equivalent circuit diagram of FIG. 28B, the structure shown in FIG. 28A has a $TFT_1$ and $TFT_2$ that are diode-connected in parallel to each other, and each have a gate length L. The channel widths $W_1$ and $W_2$ of the $TFT_1$ and $TFT_2$ are varied so that the desired resistance values can be obtained.

Figure 27B:
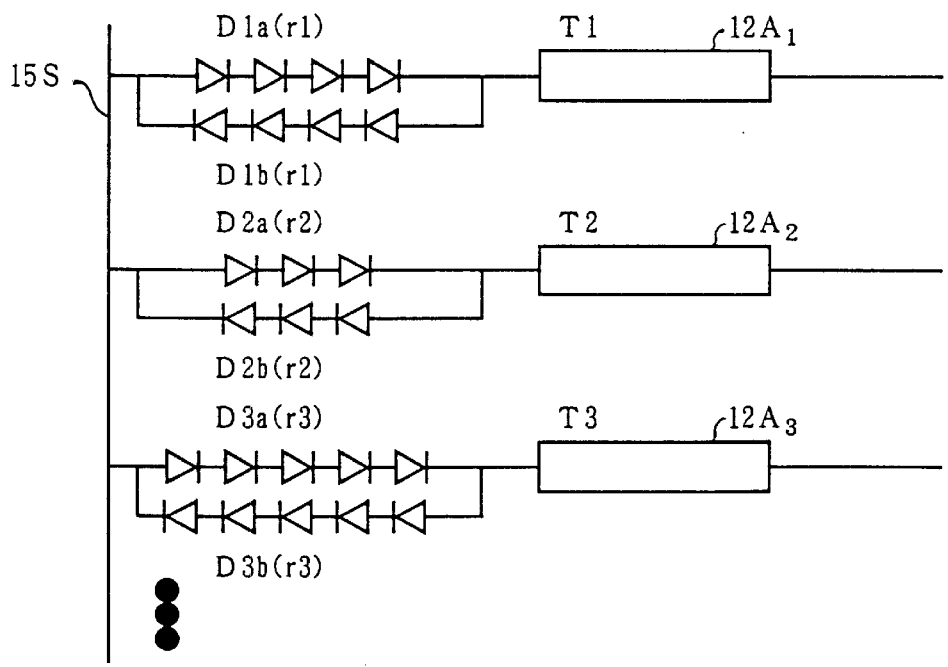

FIG. 27B shows a modification of the structure shown in FIG. 27A, in which modification of the connected TFT diodes is varied so as to obtain desired resistance values.

Tenth Embodiment

Figure 29A:
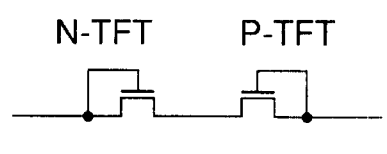
FIGS. 29A and 29B illustrate an example structure of a tenth embodiment of the present invention.
Figure 29B:
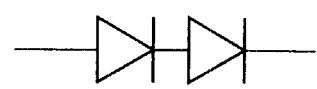

FIGS. 29A and 29B show the structures of resistance elements $r_1$ to $r_n$ in accordance with a tenth embodiment of the present invention.

As shown in FIG. 29B, each resistance element has diodes connected in series to each other in this embodiment. As shown in FIG. 29A, a diode-connected n-channel TFT and a p-channel TFT are connected in series. In this structure, the variation of diode characteristics with the fluctuation of the threshold voltage of the TFT can be effectively compensated.

Figure 30:
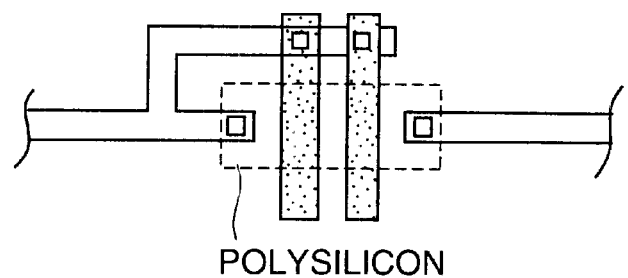
FIG. 30 illustrates a further embodiment of the present invention.

Furthermore, as shown in FIG. 30, diode-connected TFTs having a multiple gate structure can be used as the resistance elements $r_1$ to $r_n$.

The present invention is not limited to the specifically disclosed embodiments, but variations and modifications may be made without departing from the scope of the present invention.

The present application is based on Japanese priority application No. 11-310409, filed on Oct. 29, 1999, the entire contents of which are hereby incorporated by reference.

What is claimed is:

1. A method of producing a thin-film transistor on an insulating substrate, comprising the steps of:
    forming a polysilicon pattern on the insulating substrate, the polysilicon pattern including a first region of a first conductivity, a second region of the first conductivity, a first bridging region that connects the first region and the second region, and a second bridging region that also connects the first region and the second region;
    forming an insulating film on the insulating substrate in such a manner that the insulating film covers the polysilicon pattern;
    forming a gate electrode pattern on the insulating film in such a manner that the gate electrode pattern covers the first bridging region;
    forming a wiring pattern on the first region in such a manner that the wiring pattern is in contact with the first region; and
    cutting the second bridging region after the step of forming the wiring pattern.

2. The method as claimed in claim 1, wherein the step of forming the polysilicon pattern includes a step of providing conductivity to the second bridging region.

3. The method as claimed in claim 2, wherein:
    the step of forming the polysilicon pattern includes a step of providing the first conductivity to the first region and the second region; and
    the step of providing conductivity to the second bridging region is performed at the same time as the step of providing the first conductivity to the first region and the second region.

4. The method as claimed in claim 1, further comprising the steps of:
    depositing a second insulating film on the insulating substrate in such a manner that the second insulating film covers the gate electrode pattern; and
    forming an opening in the second insulating film so as to expose the second bridging region,
    the step of depositing the second insulating film and the step of forming the opening being performed before the step of forming the wiring pattern, but after the step of forming the gate electrode pattern,
    wherein the step of cutting the second bridging region includes a step of removing the second bridging region from the opening.

5. The method as claimed in claim 4, wherein:
    the step of forming the wiring pattern is performed in such a manner that the wiring pattern is formed on the second insulating film; and
    said method further comprising the steps of:
        depositing a third insulating film on the second insulating film in such a manner that the third insulating film covers the wiring pattern; and
        forming another opening in the third insulating film so as to expose the opening in the second insulating film,
        the step of depositing the third insulating film and the step of forming said another opening being performed before the step of cutting the second bridging region but after the step of forming the wiring pattern, and
        the step of cutting the second bridging region including the step of removing the second bridging region from the opening exposed through said another opening.

6. The method as claimed in claim 5, wherein the step of cutting the second bridging region is performed substantially at the same time as the step of forming said another opening.

7. The method as claimed in claim 5, wherein the step of cutting the second bridging region is performed after the step of forming said another opening in said third insulating film so as to expose the wiring pattern.

8. A method of producing a liquid-crystal display device including a thin-film transistor formed on a glass substrate, said method comprising the steps of:
    forming a polysilicon pattern on the glass substrate, the polysilicon pattern including a first region of a first conductivity, a second region of the first conductivity, a first bridging region that connects the first region and the second region, and a second bridging region that also connects the first region and the second region;
    forming an insulating film on the glass substrate in such a manner that the insulating film covers the polysilicon pattern;
    forming a gate electrode pattern on the insulating film in such a manner that the gate electrode pattern covers the first bridging region;
    forming a wiring pattern on the first region in such a manner that the wiring pattern is in contact with the first region; and
    cutting the second bridging region after the step of forming the wiring pattern.

9. The method as claimed in claim 8, wherein the step of forming the polysilicon pattern includes a step of providing conductivity to the second bridging region.

10. The method as claimed in claim 9, wherein:
    the step of forming the polysilicon pattern includes a step of providing the first conductivity to the first region and the second region; and
    the step of providing conductivity to the second bridging region is performed at the same time as the step of providing the first conductivity to the first region and the second region.

11. The method as claimed in claim 8, further comprising the steps of:
  depositing a second insulating film on the glass substrate in such a manner that the second insulating film covers the gate electrode pattern; and
  forming an opening in the second insulating film so as to expose the second bridging region,
  the step of depositing the second insulating film and the step of forming the opening being performed before the step of forming the wiring pattern but after the step of forming the gate electrode pattern,
  wherein the step of cutting the second bridging region includes a step of removing the second bridging region from the opening.

12. The method as claimed in claim 11, wherein:
  the step of forming the wiring pattern is performed in such a manner that the wiring pattern is formed on the second insulating film; and
  said method further comprises the steps of:
    depositing a third insulating film on the second insulating film in such a manner that the third insulating film covers the wiring pattern; and
    forming another opening in the third insulating film so as to expose the opening in the second insulating film,
  the step of depositing the third insulating film and the step of forming said another opening being performed before the step of cutting the second bridging region but after the step of forming the wiring pattern; and
  the step of cutting the second bridging region includes the step of removing the second bridging region from the opening exposed through said another opening.

13. The method as claimed in claim 12, wherein the step of cutting the second bridging region is performed substantially at the same time as the step of forming said another opening.

14. The method as claimed in claim 12, wherein the step of cutting the second bridging region is performed after the step of forming said another opening in the third insulating film to expose the wiring pattern.

* * * * *